United States Patent
Takahashi

(10) Patent No.: US 11,627,662 B2
(45) Date of Patent: Apr. 11, 2023

(54) PASSIVE COMPONENT AND ELECTRONIC DEVICE

(71) Applicant: TAIYO YUDEN CO., LTD., Tokyo (JP)

(72) Inventor: Osamu Takahashi, Takasaki (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 0 days.

(21) Appl. No.: 17/464,450

(22) Filed: Sep. 1, 2021

(65) Prior Publication Data

US 2021/0400816 A1    Dec. 23, 2021

Related U.S. Application Data

(63) Continuation of application No. 16/791,863, filed on Feb. 14, 2020, now Pat. No. 11,153,972.

(30) Foreign Application Priority Data

Feb. 28, 2019    (JP) .............................. JP2019-036843

(51) Int. Cl.
*H05K 1/18*        (2006.01)
*H01G 2/06*        (2006.01)
(Continued)

(52) U.S. Cl.
CPC ........... *H05K 1/181* (2013.01); *H01F 27/292* (2013.01); *H01G 2/065* (2013.01); *H01G 4/232* (2013.01);
(Continued)

(58) Field of Classification Search
CPC .......... H05K 1/111; H05K 1/181; H01G 2/06; H01G 2/065; H01G 4/232; H01G 4/242
See application file for complete search history.

(56) References Cited

U.S. PATENT DOCUMENTS 9,978,514 B2    5/2018  Han et al.
10,658,118 B2 *  5/2020  Park ........................ H01G 4/30
(Continued)

FOREIGN PATENT DOCUMENTS

JP    2000348939 A    12/2000
JP    2006324490 A    11/2006
(Continued)

OTHER PUBLICATIONS

Non-Final Office Action issued by U.S. Patent and Trademark Office, dated Dec. 10, 2020, for U.S. Appl. No. 16/791,863 (13 pages).
(Continued)

*Primary Examiner* — Jeremy C Norris
(74) *Attorney, Agent, or Firm* — Law Office of Katsuhiro Arai

(57) ABSTRACT

In an exemplary embodiment, a passive component, which is a surface mounting component, includes: a substrate body having insulating property; an internal conductor built into the substrate body; and at least one external electrode provided on a planar mounting face of the substrate body and electrically connected to the internal conductor; wherein the external electrode has a face parallel with the planar mounting face of the substrate body, and a concaved part which is inwardly concaved relative to the parallel face toward the substrate body and is located, as viewed in a direction perpendicular to the parallel face, inside the parallel surface so as to be surrounded by the parallel surface.

10 Claims, 18 Drawing Sheets

(51) Int. Cl.
    *H01F 27/29*        (2006.01)
    *H01G 4/232*        (2006.01)
(52) U.S. Cl.
    CPC ............... *H05K 2201/1003* (2013.01); *H05K 2201/10015* (2013.01); *H05K 2201/10636* (2013.01)

(56) References Cited

U.S. PATENT DOCUMENTS

2011/0051315 A1\* 3/2011 Dogan ................ C04B 35/4682
                                                    361/321.1
2019/0378656 A1\* 12/2019 Sim ..................... H01G 4/2325

FOREIGN PATENT DOCUMENTS

JP          2015008313 A       1/2015
JP          2015035589 A       2/2015

OTHER PUBLICATIONS

Notice of Allowance issued by U.S Patent and Trademark Office, dated Jun. 7, 2021, for U.S. Appl. No. 16/791,863 (7 pages).

\* cited by examiner

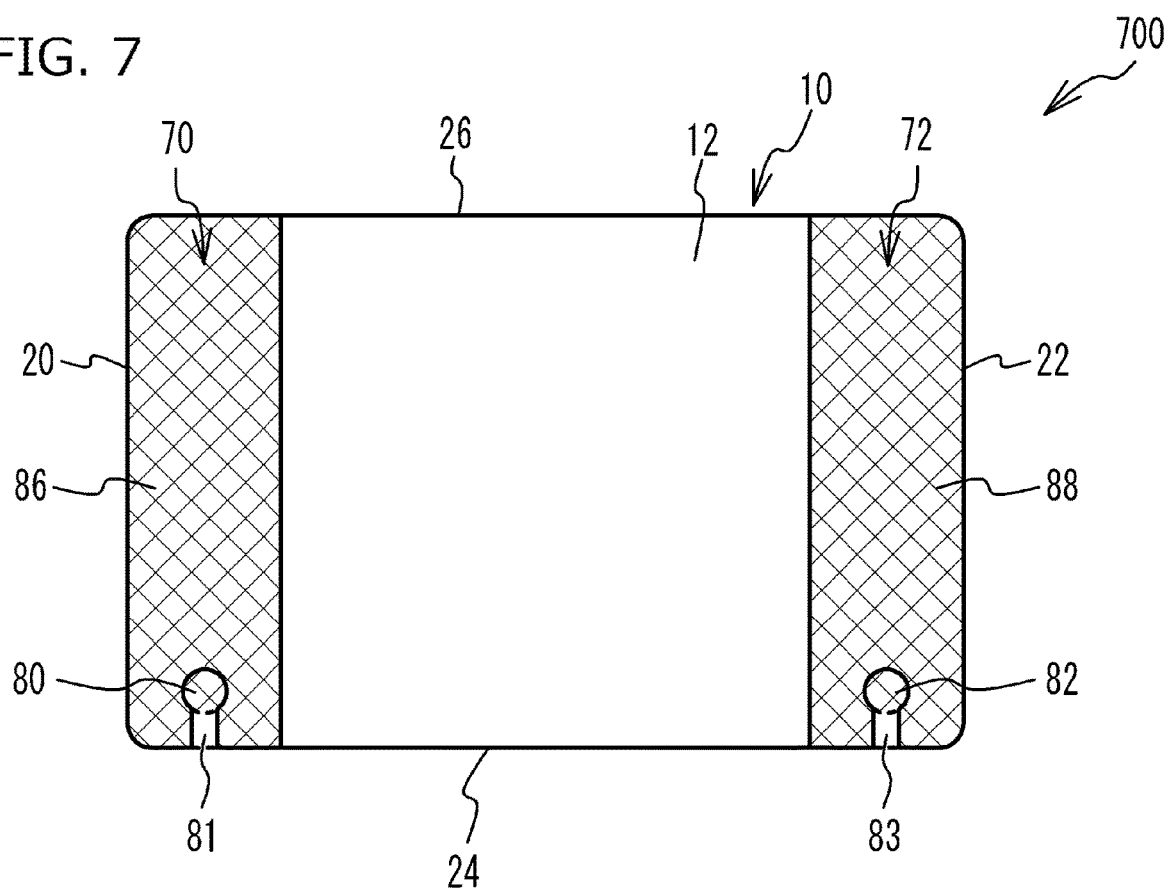

PASSIVE COMPONENT AND ELECTRONIC DEVICE

CROSS-REFERENCE TO RELATED APPLICATIONS

This application is a continuation of U.S. patent application Ser. No. 16/791,863, filed Feb. 14, 2020, which claims priority to Japanese Patent Application No. 2019-036843, filed Feb. 28, 2019, each disclosure of which is incorporated herein by reference in its entirety. The applicant herein explicitly rescinds and retracts any prior disclaimers or disavowals made in any parent, child or related prosecution history with regard to any subject matter supported by the present application.

BACKGROUND

Field of the Invention

The present invention relates to a passive component and an electronic device.

Description of the Related Art

The progress of high-density mounting of passive components, spurred by the functional enhancement of electronic devices, is making passive components smaller and shorter in height. When mounting passive components on a circuit board with a solder, formation of solder fillets on the passive components increases the mounting area and thus makes it difficult to achieve high-density mounting. In light of the above, coil components are known, wherein both end parts of a coil conductor are led out to a mounting face of a laminate body and connected to external electrodes provided on this mounting face, in order to prevent solder fillets from forming (refer to Patent Literature 1, for example).

Also known are constitutions, wherein projecting parts are provided on the surfaces of a substrate body where terminal electrodes are provided, in order to improve the joining strength between the substrate body and the terminal electrodes (refer to Patent Literature 2, for example). In this case, the component size increases.

BACKGROUND ART LITERATURES

[Patent Literature 1] Japanese Patent Laid-open No. 2000-348939
[Patent Literature 2] Japanese Patent Laid-open No. 2006-324490

SUMMARY

Passive components are mounted on circuit boards with a solder supplied to land patterns on the circuit boards. With the increase in the mounting densities of passive components on circuit boards, passive components are becoming smaller and lighter in weight. A smaller passive component means smaller land patterns on a circuit board, which reduces the amount of solder supplied to the land patterns. As a result, the joining strength between the passive component and the circuit board decreases.

An object of the present invention is to provide a passive component that can prevent its joining strength with a circuit board from decreasing, while preventing the component size from increasing.

The present invention is a passive component, which is a surface mounting component, comprising: a substrate body having insulating property; an internal conductor built into the substrate body; and an external electrode provided on a mounting face of the substrate body and electrically connected to the internal conductor; wherein the external electrode has a face parallel with the mounting face of the substrate body, and a concaved part which is concaved with reference to the parallel face toward the mounting-face side of the substrate body and whose contour at the parallel face is formed by a round plane figure (roughly or substantially circular or oval, including a shape of a circle or oval, a part of which is missing).

In the aforementioned constitution, the constitution may be such that: the shape of the concaved part at the parallel face is circular or oval; and the external electrode has the concaved part provided on the inner side of an outer edge of the external electrode, and a groove part extending from the concaved part to the outer edge of the external electrode and open to the outer edge of the external electrode.

In the aforementioned constitution, the constitution may be such that the mounting face of the substrate body is exposed at the bottom face of the groove part.

In the aforementioned constitution, the constitution may be such that: multiple external electrodes—all identical to the aforementioned external electrode—are provided on the mounting face of the substrate body; the multiple external electrodes include a first external electrode placed toward one side of a pair of opposing sides, and a second external electrode placed toward the other side, of the mounting face of the substrate body; the groove part of the first external electrode opens to, among the outer edges of the first external electrode, the outer edge facing the second external electrode; and the groove part of the second external electrode opens to, among the outer edges of the second external electrode, the outer edge facing the first external electrode.

In the aforementioned constitution, the constitution may be such that the groove part of the first external electrode and the groove part of the second external electrode are open in a staggered manner in a direction intersecting the direction in which the first external electrode and the second external electrode are facing each other.

In the aforementioned constitution, the constitution may be such that the concaved part is open to an outer edge of the external electrode.

In the aforementioned constitution, the constitution may be such that: multiple external electrodes—all identical to the aforementioned external electrode—are provided on the mounting face of the substrate body; the multiple external electrodes include a first external electrode placed toward one side of a pair of opposing sides, and a second external electrode placed toward the other side, of the mounting face of the substrate body; the concaved part of the first external electrode opens to, among the outer edges of the first external electrode, the outer edge facing the second external electrode; the concaved part of the second external electrode opens to, among the outer edges of the second external electrode, the outer edge facing the first external electrode; and the concaved part of the first external electrode and the concaved part of the second external electrode are provided in a staggered manner in a direction intersecting the direction in which the first external electrode and the second external electrode are facing each other.

In the aforementioned constitution, the constitution may be such that: multiple external electrodes—all identical to the aforementioned external electrode—are provided on the mounting face of the substrate body; the multiple external electrodes include a first external electrode placed toward one side of a pair of opposing sides, and a second external electrode placed toward the other side, of the mounting face of the substrate body; and the concaved part of the first external electrode and the concaved part of the second external electrode are provided at positions symmetrical to each other with respect to the center of the mounting face of the substrate body.

In the aforementioned constitution, the constitution may be such that: the internal conductor includes a lead conductor which is led out to the mounting face of the substrate body and connected to the external electrode; the tip face representing a cross-section at the tip of the lead conductor is concaved from the mounting face of the substrate body; and the concaved part is formed as a result of the external electrode covering the mounting face of the substrate body and the tip face of the lead conductor.

The present invention is an electronic device comprising: the aforementioned passive component; and a circuit board on which the passive component is mounted as a result of an external electrode of the passive component joined to a land pattern with a solder.

The present invention is an electronic device comprising: a passive component having a substrate body having insulating property, an internal conductor built into the substrate body, and an external electrode provided on a mounting face of the substrate body and electrically connected to the internal conductor; and a circuit board on which the passive component is mounted as a result of the external electrode joined to a land pattern with a solder; wherein the external electrode has a face parallel with the mounting face of the substrate body, a concaved part which is concaved with reference to the parallel face toward the mounting face side of the substrate body and is provided on the inner side of an outer edge of the external electrode and whose contour at the parallel face is formed by a round plane figure (roughly or substantially circular or oval, including a shape of a circle or oval, a part of which is missing), and a groove part extending from the concaved part and open to, among the outer edges of the external electrode, an outer edge positioned away from the land pattern, other than outer edges on the outer periphery of the mounting face of the substrate body.

According to the present invention, increase in component size can be prevented, while at the same time decrease in the joining strength of a passive component with respect to a circuit board due to a reduced amount of solder reflecting a smaller passive component size can be prevented.

BRIEF DESCRIPTION OF THE DRAWINGS

FIG. 1A is a cross-sectional view of an electronic device according to the invention under the present application for patent, while

FIG. 2A is a perspective view showing the coil component pertaining to the first embodiment of the invention under the present application for patent, while

FIGS. 5A and 5B are cross-sectional views of the coil component pertaining to the second embodiment of the invention under the present application for patent, while

FIG. 7 is a plan view, looking at the bottom face, through the inside, from the top face side, of the coil component pertaining to the third embodiment of the invention under the present application for patent.

FIG. 10A is a transparent perspective view, while

FIG. 13A is a perspective view of the coil component pertaining to the sixth embodiment of the invention under the present application for patent, while

FIG. 15A is a perspective view of the coil component pertaining to the seventh embodiment of the invention under the present application for patent, while

FIG. 16A is a perspective view of the capacitor component pertaining to the eighth embodiment of the invention under the present application for patent, while

DESCRIPTION OF THE SYMBOLS

Figure 1A:
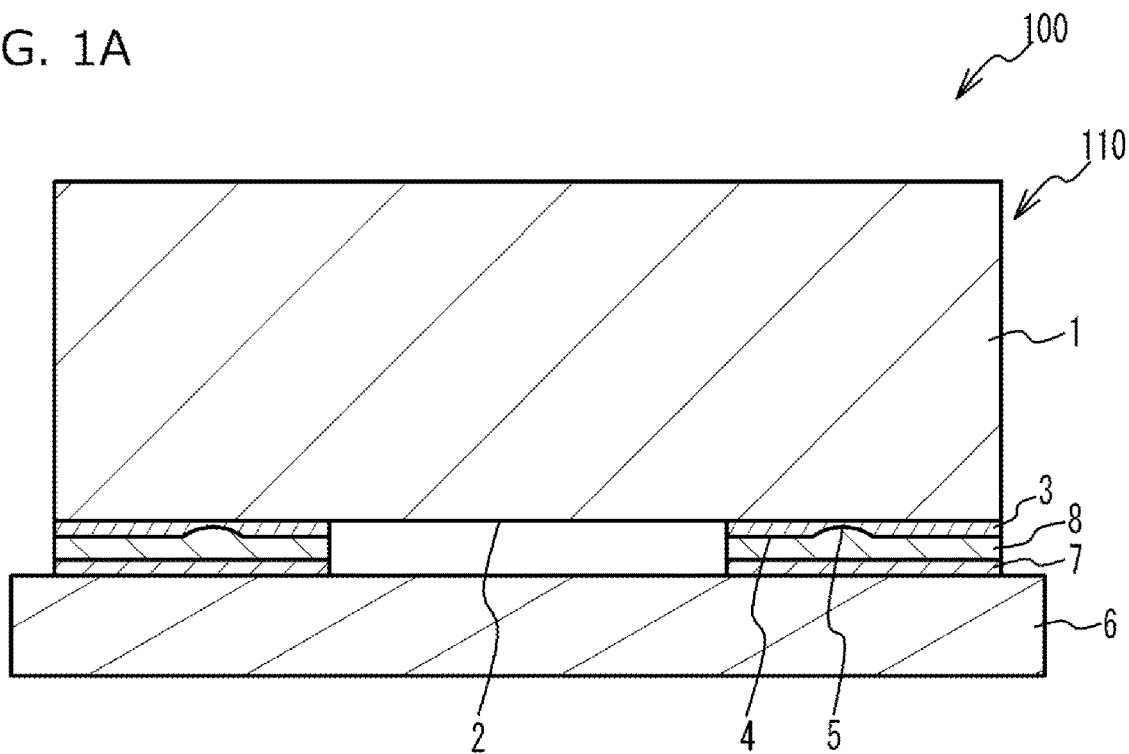

1 Substrate body
2 Mounting face
3 External electrode
4 Face
5 Concaved part
6 Circuit board
7 Land pattern
8 Solder
9 External electrode
10 Substrate body
12 Bottom face
14 Top face 16a, 16b End face
18a, 18b Side face
20 to 26 Side
28, 30 Center line
32 Center
50 to 50d Internal conductor
52 to 52c Coil conductor
54 to 54c Lead conductor
56 to 56c Lead conductor
58a to 58c Conductor
60 Capacitor conductor
62a, 62b Lead conductor
70 to 70d External conductor
72 to 72d External conductor
80 to 80d Concaved part
81 Groove part
82 to 82d Concaved part
83 Groove part
86 to 86b Face
88 to 88b Face
90 Circuit board
92 Land pattern
94 Solder
110, 210 Passive component
500, 600, 700, 800, 900, 1000, 1100 Coil component
1200 Capacitor component
100, 200, 1300 Electronic device

DETAILED DESCRIPTION OF EMBODIMENTS

Figure 1B:
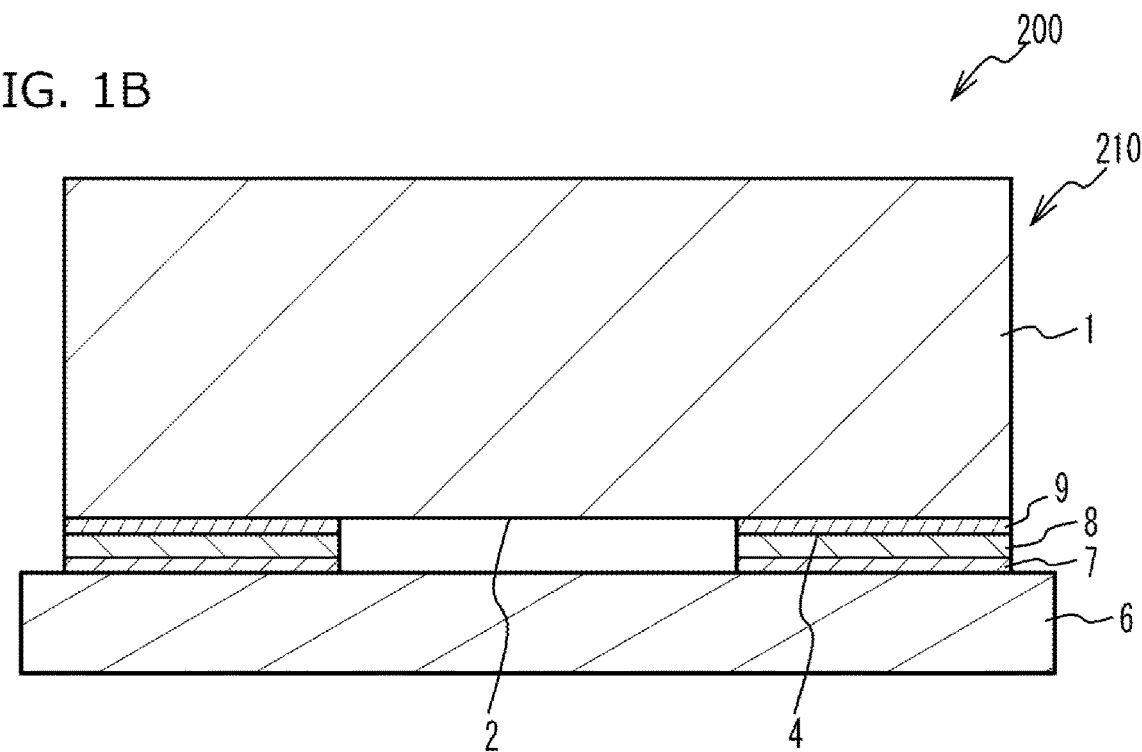
FIG. 1B is a cross-sectional view of an electronic device representing a comparative example.

First, the constitutions as well as operations and effects of the invention under the present application for patent are explained. FIG. 1A is a cross-sectional view of an electronic device according to the invention under the present application for patent, while FIG. 1B is a cross-sectional view of an electronic device representing a comparative example. As shown in FIG. 1A, the electronic device 100 is such that a passive component 110 comprising a substrate body 1 with a built-in internal conductor and external electrodes 3 provided on a mounting face 2 of the substrate body 1, is mounted on a circuit board 6. Each external electrode 3 has a face 4 parallel with the mounting face 2 of the substrate body 1, as well as a concaved part 5 which is concaved with reference to the parallel face 4 toward the mounting face 2 side of the substrate body 1. The concaved part 5 is such that its shape at the face 4 is circular or oval. The passive component 110 is mounted on a circuit board 6 as a result of each external electrode 3 joined to a land pattern 7 on the circuit board 6 with a solder 8.

As shown in FIG. 1B, the electronic device 200 has a passive component 210 mounted on a circuit board 6. The surface of each external electrode 9 of the passive component 210 is formed by a face 4 parallel with the mounting face 2 of the substrate body 1 and no concaved part is provided thereon.

The acceleration of size reduction of passive components is making land patterns 7 on circuit boards 6 smaller and thereby reducing the amounts of solder 8 supplied to the land patterns 7. This means that, when the surface of the external electrode 9 is formed only by a face 4 parallel with the mounting face 2 of the substrate body 1, as is the case of the passive component 210, the solder 8 thickness between the external electrode 9 and the land pattern 7 becomes thinner, and the joining strength between the passive component 210 and the circuit board 6 decreases as a result.

With the passive component 110, on the other hand, the external electrode 3 has a face 4 parallel with the mounting face 2 of the substrate body 1, as well as a concaved part 5 which is concaved with reference to the parallel face 4 toward the mounting face 2 side of the substrate body 1 and whose shape at the face 4 is circular or oval. As a result, the solder 8 joining the external electrode 3 and the land pattern 7 is joined to the face 4 of the external electrode 3 and also enters the concaved part 5. This means that, even when the size of the passive component 110 is reduced and the amount of the solder 8 supplied to the land pattern 7 decreases, the solder 8 thickness increases at the concaved part 5 and this, together with the anchor effect of the solder 8 that has entered the concaved part 5, can prevent the joining strength between the passive component 110 and the circuit board 6 from decreasing. Because the shape of the concaved part 5 at the face 4 is circular or oval, decrease in the joining strength between the passive component 110 and the circuit board 6 can be prevented in all directions parallel with the face 4. Additionally, because the concaved part 5 is provided, but no projecting part is provided, on the external electrode 3, increase in the size of the passive component 110 can be prevented. As described above, because the external electrode 3 has the face 4 parallel with the mounting face 2 of the substrate body 1, as well as the concaved part 5 which is concaved with reference to this parallel face 4 toward the mounting face 2 side of the substrate body 1 and whose shape at the face 4 is circular or oval, decrease in the joining strength of the passive component 110 with respect to the circuit board 6 can be prevented, even when the size of the passive component 110 is reduced. Moreover, increase in the size of the passive component 110 can be prevented.

Embodiments of the invention under the present application for patent are explained below by referring to the drawings as deemed appropriate. Constitutional elements that are common in multiple drawings are denoted with the same reference symbols throughout the multiple drawings. It should be noted that, for the sake of explanation, the scale in which each drawing was written is not necessarily accurate.

Figure 2A:
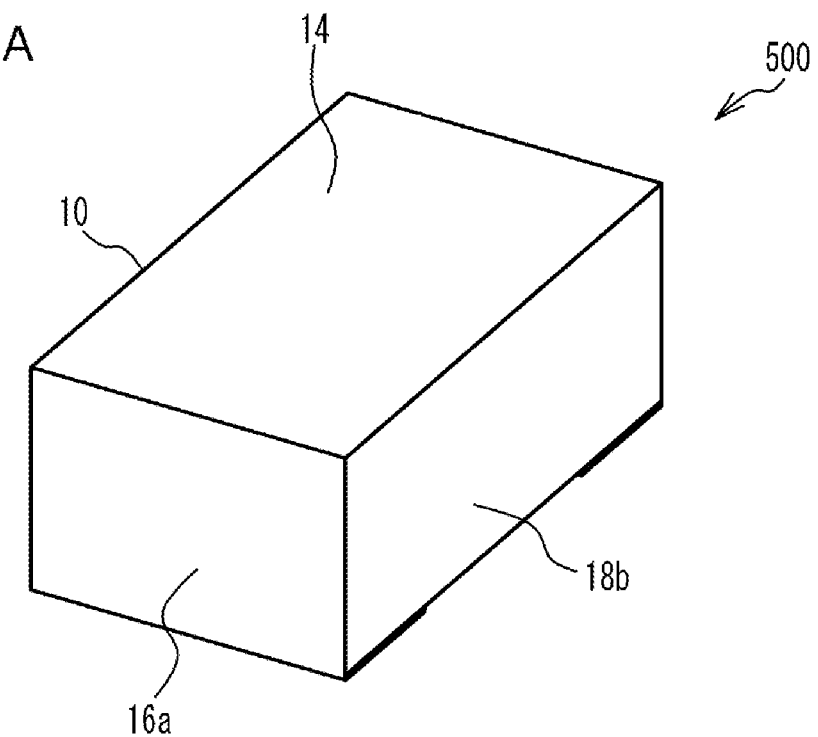
Figure 2B:
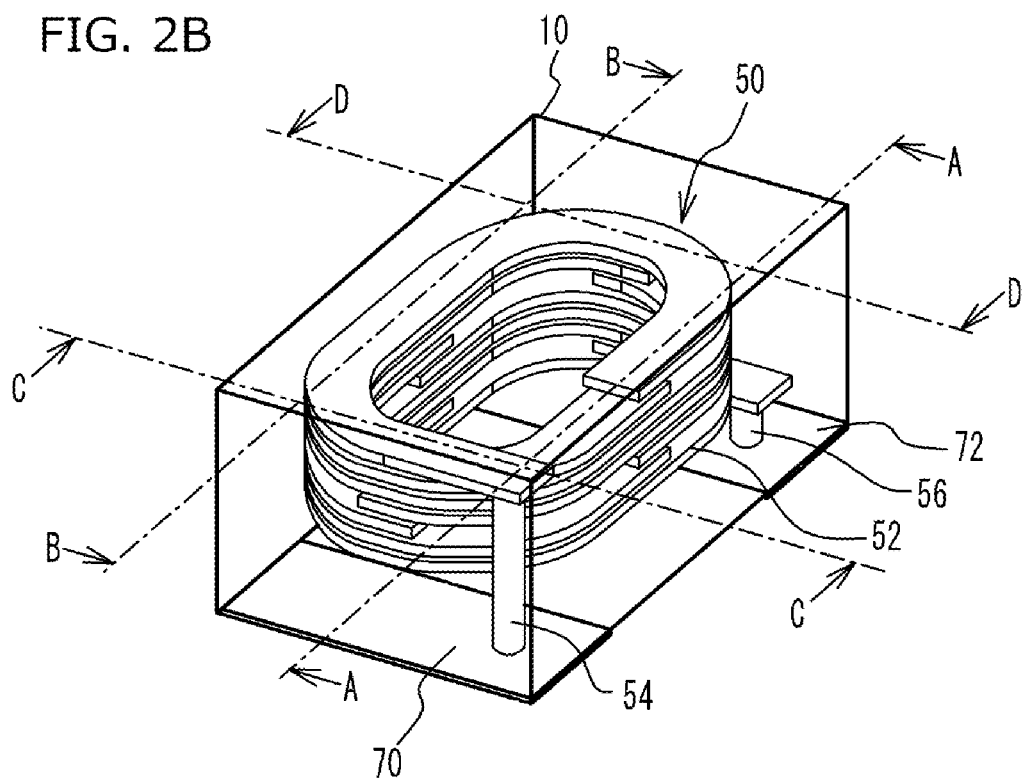
FIG. 2B is a transparent perspective view showing the inside thereof.
Figure 3A:
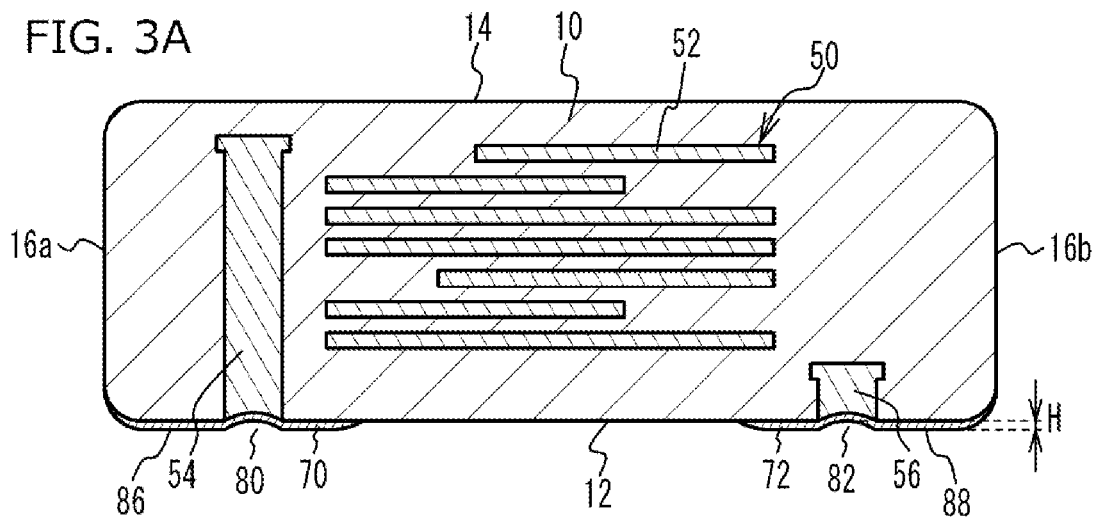
FIGS. 3A to 3D are views of cross-sections A-A to D-D in FIG. 2B, respectively.
Figure 3B:
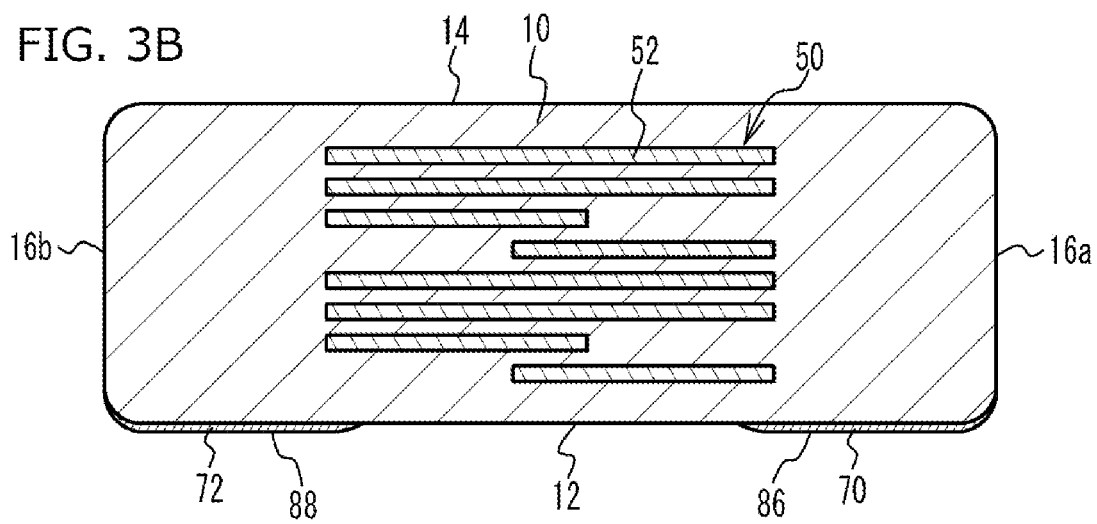
Figure 3C:
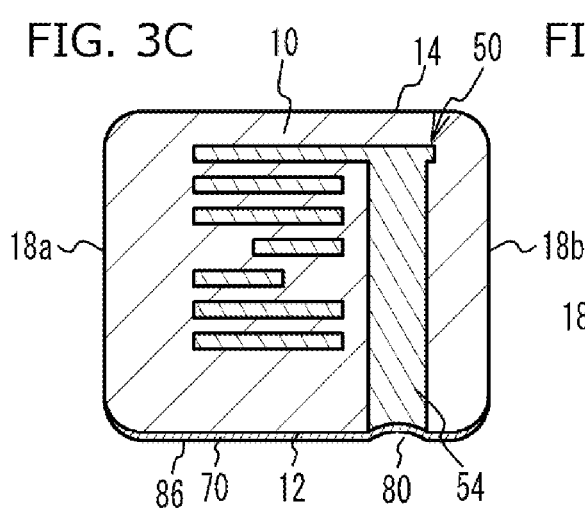
Figure 3D:
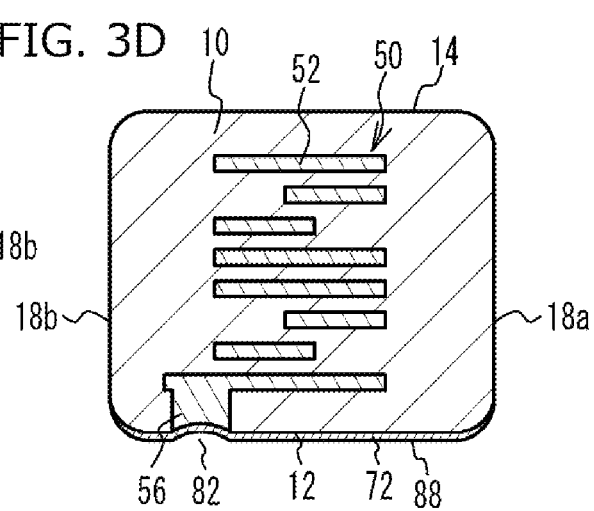
Figure 4:
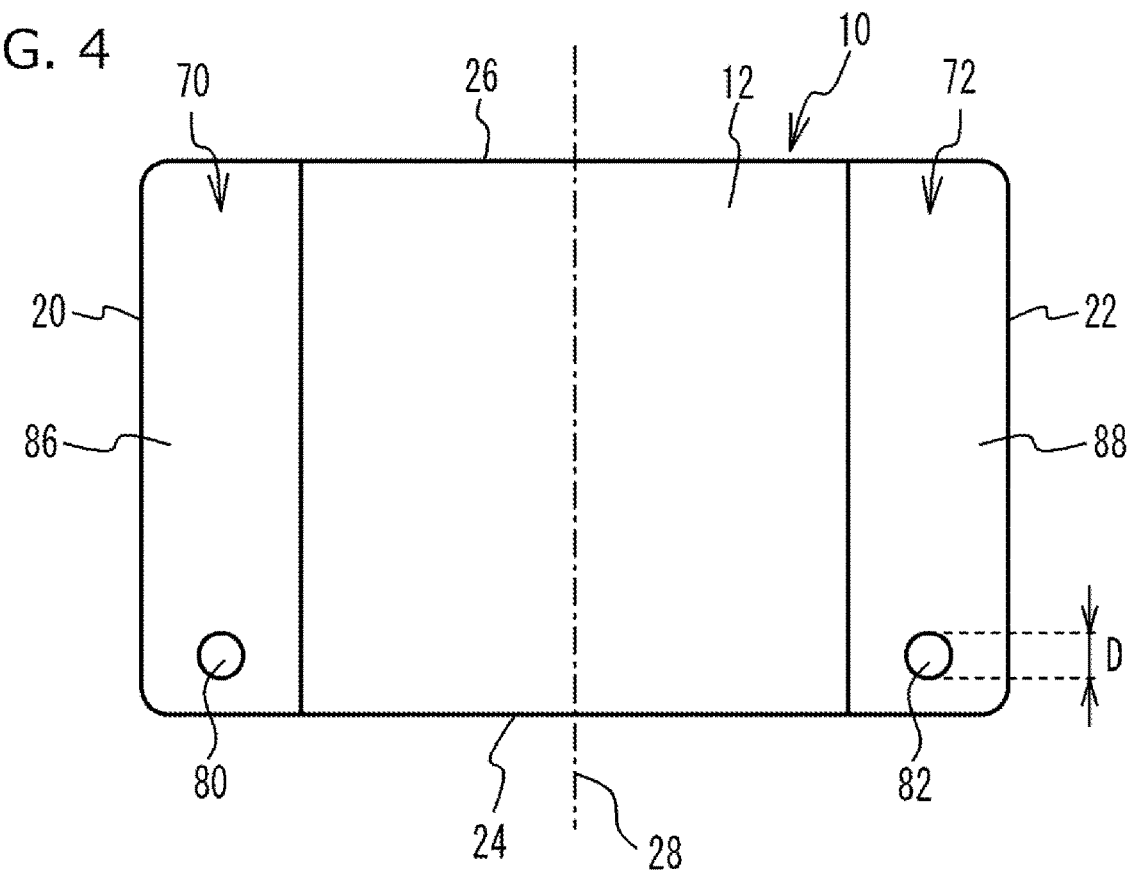
FIG. 4 is a plan view, looking at the bottom face, through the inside, from the top face side, of the coil component pertaining to the first embodiment of the invention under the present application for patent.

The coil component 500 pertaining to the first embodiment of the invention under the present application for patent is explained by referring to FIGS. 2A, 2B, 3A to 3D, and 4. FIG. 2A is a perspective view showing the coil component 500 pertaining to the first embodiment of the invention under the present application for patent, while FIG. 2B is a transparent perspective view showing the inside thereof. FIGS. 3A to 3D are views of cross-sections A-A to D-D in FIG. 2B, respectively. FIG. 4 is a plan view, looking at the bottom face, through the inside, from the top-face side, of the coil component 500 pertaining to the first embodiment of the invention under the present application for patent. It should be noted that, in FIG. 4, the internal conductor provided in the substrate body 10 is not shown for the sake of illustrative clarity. As shown in FIGS. 2A, 2B, 3A to 3D, and 4, the coil component 500 comprises a substrate body 10, an internal conductor 50 built into the substrate body 10, and external electrodes 70, 72 provided on a mounting face, among all surfaces, of the substrate body 10.

The substrate body 10 is shaped as a rectangular solid having a bottom face 12, a top face 14, a pair of end faces 16a, 16b, and a pair of side faces 18a, 18b. The bottom face 12 is a mounting face, while the top face 14 is a face on the side opposite to the bottom face 12. The pair of end faces 16a, 16b are faces connected to the short sides of the bottom face 12 and top face 14, while the pair of side faces 18a, 18b are faces connected to the long sides of the bottom face 12 and top face 14. It should be noted that the substrate body 10 is not limited to having a perfect rectangular solid shape;

instead, each apex may be rounded, each ridge (boundary part of each face) may be rounded, or each face may be curved, etc., for example. In other words, the term "rectangular solid shape" also includes these roughly rectangular solid shapes.

The substrate body 10 has insulating property. The substrate body 10 may be formed by a magnetic material, or it may be formed by a non-magnetic material. Magnetic materials include, for example, Ni—Zn, Mn—Zn, and other ferrite materials, Fe—Si—Cr, Fe—Si—Al, Fe—Si—Cr—Al, and other soft magnetic alloy materials, Fe, Ni, and other magnetic metal materials, amorphous magnetic metal materials, nanocrystal magnetic metal materials, and resins containing metal magnetic grains, and the like. Non-magnetic materials include, for example, silicon oxide ($SiO_2$), aluminum oxide ($Al_2O_3$), zirconium oxide ($ZrO_2$), titanium oxide ($TiO_2$), and other inorganic materials, thermosetting resins and other resin materials, borosilicate glass and other glass materials, and materials obtained by mixing an inorganic material or other filler into a resin material, and the like.

The internal conductor 50 is formed by, for example, copper, aluminum, nickel, silver, platinum, palladium, or other metal material, or an alloy material containing the foregoing. The internal conductor 50 includes a coil conductor 52 that forms a coil, as well as lead conductors 54, 56 led out from the coil conductor 52. The coil conductor 52 extends radially. The coil conductor 52 has individual turn units as prescribed, and it also has a coil axis crossing at right angles with a face defined by the individual turn units. The bottom face 12 and top face 14 of the substrate body 10 are faces intersecting (such as crossing at right angles) the coil axis. The end faces 16a, 16b and side faces 18a, 18b of the substrate body 10 are faces not intersecting the coil axis, but parallel with the coil axis.

The lead conductor 54 is led out straight from, of the pair of end parts of the coil conductor 52, the end part positioned on the top face 14 side of the substrate body 10, toward the bottom face 12 of the substrate body 10. The lead conductor 56 is led out straight from, of the pair of end parts of the coil conductor 52, the end part positioned on the bottom face 12 side of the substrate body 10, toward the bottom face 12 of the substrate body 10. In other words, one of the end parts of the lead conductors 54, 56 is connected to the coil conductor 52. The other end part of the lead conductors 54, 56 is provided in a manner concaved from the bottom face 12 of the substrate body 10. The distance from the portion, most concaved from the bottom face 12 of the substrate body 10, of the tip face representing a cross-section at the tip of each lead conductor 54 or 56, to the bottom face 12 of the substrate body 10, is approx. 5 μm to 20 μm, for example. The diameter of each lead conductor 54 or 56 is approx. 50 μm to 300 μm, for example.

The external electrodes 70, 72 are external terminals for surface mounting. The external electrode 70 is provided on the bottom face 12 of the substrate body 10, on the side of a side 20 of the bottom face 12. The external electrode 72 is provided on the bottom face 12 of the substrate body 10, on the side of a side 22 of the bottom face 12. The sides 20, 22 are a pair of opposing short sides. The external electrodes 70, 72 are provided only on the bottom face 12, among all surfaces, of the substrate body 10, and not provided on the top face 14, end faces 16a, 16b, or side faces 18a, 18b. In other words, the external electrodes 70, 72 are each a monohedral electrode provided only on one face, among all surfaces, of the substrate body 10.

The external electrode 70 is connected to the lead conductor 54 exposed on the bottom face 12 of the substrate body 10. The external electrode 72 is connected to the lead conductor 56 exposed on the bottom face 12 of the substrate body 10. The external electrodes 70, 72 are formed by multiple metal layers, for example. The external electrodes 70, 72 have a multi-layer structure comprising, for example: a bottom layer formed by copper, aluminum, nickel, silver, platinum, palladium, or other metal material or an alloy material containing the foregoing; a middle layer formed by silver or a conductive resin containing silver; and a top layer being a plating layer of nickel and tin. It should be noted that the layer structure of the external electrodes 70, 72 is not limited to the one illustrated; instead, an intermediate layer may be provided between each pair of layers, or a topmost layer may be provided on top of the top layer, and the like.

The external electrode 70 has a face 86 parallel with the bottom face 12 of the substrate body 10, as well as a concaved part 80 which is concaved with reference to this parallel face 86 toward the bottom face 12 side of the substrate body 10. The external electrode 72 has a face 88 parallel with the bottom face 12 of the substrate body 10, as well as a concaved part 82 which is concaved with reference to this parallel face 88 toward the bottom face 12 side of the substrate body 10. It should be noted that the term "parallel face" used here does not mean "parallel" in the strictest sense, and a slight inclination, etc., corresponding to a manufacturing error or so may be included.

The concaved parts 80, 82 have a circular shape at the parallel faces 86, 88, assume a spherically concaved shape, and are positioned on the inner side of the outer edges of the external electrodes 70, 72. A spherical recess indicates a shape characterized in that the recessed depth is shallower on the outer periphery portion of the recess and the recessed depth becomes deeper toward the center part of the recess. A spherical concave can also be described as a dome-shaped concave or reverse dome shape. It should be noted that the term "circular shape" used here does not mean "circular shape" in the strictest sense, and it may include circular shapes that are slightly distorted (due to inevitable manufacturing distortions, for example). The concaved part 80 of the external electrode 70 is formed, for example, at the position where the lead conductor 54 is exposed from the bottom face 12 of the substrate body 10, in such a way that the tip face of the lead conductor 54 is concaved from the bottom face 12 of the substrate body 10. Similarly, the concaved part 82 of the external electrode 72 is formed, for example, at the position where the lead conductor 56 is exposed from the bottom face 12 of the substrate body 10, in such a way that the tip face of the lead conductor 56 is concaved from the bottom face 12 of the substrate body 10.

The concaved parts 80, 82 are provided, for example, at positions symmetrical to each other with respect to a center line 28 passing through the respective centers of the sides 24, 26, representing a pair of long sides, of the bottom face 12 of the substrate body 10. The depths H of the deepest parts of the concaved parts 80, 82 from the faces 86, 88 are approx. 5 μm to 20 μm, for example, and 10 μm in one example. The diameters D of the concaved parts 80, 82 at the faces 86, 88 are 50 μm to 300 μm, for example, and 150 μm in one example.

Now, a method for manufacturing the coil component 500 is explained. The coil component 500 is formed through steps including those in which multiple green sheets (insulating sheets) are laminated. A green sheet is an insulating precursor that will constitute a substrate body 10, etc., and is formed, for example, by applying a slurry of insulating material in a film shape using the doctor blade method, etc.

First, multiple green sheets are prepared. Of the multiple green sheets, some green sheets are laser-processed to form through holes at prescribed positions. Next, a conductive material is applied by a printing method, for example, on the green sheets in which the through holes have been formed, to form precursors to a coil conductor 52 and lead conductors 54, 56. When sintered, these will become a coil conductor 52 and lead conductors 54, 56.

Next, multiple green sheets are stacked in a prescribed order, and then a pressure is applied in the stacking direction to pressure-bond the multiple green sheets. Thereafter, the pressure-bonded green sheets are cut into individual chips using a dicer, by press-cutting, etc., and then sintered at a prescribed temperature. Here, for the conductive material used to form a coil conductor 52 and lead conductors 54, 56, using a material whose shrinkage upon sintering is greater than that of the insulating material used to form a substrate body 10, allows a structure to be obtained where the tip faces of the lead conductors 54, 56 are concaved from the bottom face 12 of the substrate body 10. As a result of this sintering, a substrate body 10 in which a coil conductor 52 and lead conductors 54, 56 are provided, is formed.

Next, external electrodes 70, 72 are formed on the bottom face 12 of the substrate body 10. The external electrodes 70, 72 are formed by paste-printing, plating, sputtering or other method used in thin-film processes. Because the tip faces of the lead conductors 54, 56 are concaved from the bottom face 12 of the substrate body 10, a concaved part 80 is formed on the external electrode 70, while a concaved part 82 is formed on the external electrode 72.

According to the coil component 500, as shown in FIGS. 3A to 3D, the external electrode 70 has a face 86 parallel with the bottom face 12 of the substrate body 10, as well as a concaved part 80 which is concaved with reference to this parallel face 86 toward the bottom face 12 side of the substrate body 10 and whose shape at the face 86 is circular. The external electrode 72 has a face 88 parallel with the bottom face 12 of the substrate body 10, as well as a concaved part 82 which is concaved with reference to this parallel face 88 toward the bottom face 12 side of the substrate body 10 and whose shape at the face 88 is circular. This way, when the external electrodes 70, 72 are joined to land patterns on a circuit board with a solder, the solder enters the concaved parts 80, 82, which will increase the solder thickness at the concaved parts 80, 82 and also produce an anchor effect from the solder that has entered the concaved parts 80, 82. As a result, decrease in the joining strength of the coil component 500 with respect to the circuit board can be prevented, even when the coil component 500 is small in size. Because the shapes of the concaved parts 80, 82 at the faces 86, 88 are circular, decrease in the joining strength of the coil component 500 with respect to the circuit board can be prevented in all directions parallel with the faces 86, 88. Additionally, because only the concaved parts 80, 82 are provided on the external electrodes 70, 72, size increase of the coil component 500 can be prevented.

If, for example, the surfaces of the external electrodes are constituted by flat faces only and no concaved parts are formed, the amount of solder supplied to the land patterns will decrease as coil components become smaller in size, and the joining strength between the coil component and the circuit board will decrease as a result, as explained using FIG. 1B. In addition, a decrease in the amount of solder paste supplied to the land patterns may cause the coil component to be mounted on the circuit board in a manner shifted from the prescribed position. For example, assume that the external electrodes of the coil component that has been picked up by a pickup unit of a component mounting machine are pressed against the solder paste that has been supplied to the land patterns; when the pressing force is weak, parts of the external electrodes may not contact the solder and remain floating. If parts of the external electrodes are not in contact with the solder and remain floating, vibrations will apply to the coil component when the pickup unit is raised by breaking the vacuum after the coil component has been pressed against the solder using the pickup unit, and may cause the position of the coil component to shift from the prescribed position. Also, if parts of the external electrodes are not in contact with the solder and remain floating, vibrations will generate in such cases where the circuit board is transferred to the fusion furnace in the process of fusing and curing the solder paste, and may cause the position of the coil component to shift from the prescribed position. Conversely, when the external electrodes of the coil component are pressed against the solder supplied to the land patterns, a strong pressing force may cause the solder to unevenly ooze out of the land patterns. In this case, reflow soldering may cause the position of the coil component to shift from the prescribed position. As the size reduction of coil components is making land patterns smaller and thereby reducing the amounts of solder supplied to the land patterns, it is becoming difficult to adjust the forces with which to press the coil components against the solder.

With the coil component 500, on the other hand, the concaved parts 80, 82 are formed on the external electrodes 70, 72 and thus, when the external electrodes 70, 72 are pressed against the solder supplied to land patterns on a circuit board, the solder enters the concaved parts 80, 82 and produces an anchor effect. This means that, even when vibrations from raising the pickup unit by breaking the vacuum or vibrations from transferring the circuit board to the fusion furnace are applied to the coil component 500, or even when the solder unevenly oozes out of the land patterns, shifting of the coil component 500 from the prescribed position is prevented. In addition, formation of the concaved parts 80, 82 on the external electrodes 70, 72 allows sufficient joining strength to be ensured between the coil component 500 and the circuit board, even when the solder thicknesses formed between the faces 86, 88 of the external electrodes 70, 72 and the land patterns become thinner. This makes it possible to mount the coil component 500 on the circuit board at a shorter height.

From the viewpoint of preventing the joining strength of the coil component 500 with respect to the circuit board from decreasing, by increasing the anchor effect from the solder entering the concaved part 80, 82 and the amount of solder for joining, the depths H of the deepest parts of the concaved part 80, 82 from the faces 86, 88 are preferably 5 μm or greater, or more preferably 8 μm or greater, or yet more preferably 12 μm or greater. The diameters D of the concaved part 80, 82 at the faces 86, 88 are preferably 50 μm or greater, or more preferably 120 μm or greater, or yet more preferably 190 μm or greater. On the other hand, from the viewpoint of exhausting the air inside the concaved parts 80, 82 and filling the entire concaved parts 80, 82 with the solder, the depths H at the deepest parts of the concaved parts 80, 82 from the faces 86, 88 are 20 μm or smaller, or more preferably 17 μm or smaller, or yet more preferably 14 μm or smaller. The diameters D of the concaved parts 80, 82 at the faces 86, 88 are, from the viewpoint of exhausting the air inside the concaved parts 80, 82 and filling the entire concaved parts 80, 82 with the solder, preferably 300 μm or smaller, or more preferably 260 μm or smaller, or yet more preferably 220 μm or smaller. By keeping to these ranges, the concaved parts 80, 82 can be formed in a stable manner using a relatively easy method.

As shown in FIGS. 3A to 3D, providing multiple external electrodes 70, 72 with concaved parts on the bottom face 12 of the substrate body 10 increases the number of concaved parts the solder will enter when the coil component 500 is mounted on a circuit board. As a result, decrease in the joining strength of the coil component 500 with respect to the circuit board can be effectively prevented.

As shown in FIG. 4, preferably the concaved part 80 of the external electrode 70 and the concaved part 82 of the external electrode 72 are provided at positions symmetrical to each other with respect to the center line 28 passing through the respective centers of the sides 24, 26, representing a pair of long sides, of the bottom face 12 of the substrate body 10. This way, the coil component 500 can be prevented from tilting irregularly when its external electrodes 70, 72 are pressed against the solder supplied to land patterns on a circuit board.

As shown in FIGS. 3A to 3D, preferably the internal conductor 50 has a coil conductor 52 that forms a coil, as well as lead conductors 54, 56 which are led out from the coil conductor 52 and whose tip faces are concaved from the bottom face 12 of the substrate body 10. Then, preferably the concaved parts 80, 82 are formed as a result of the external electrodes 70, 72 covering the bottom face 12 of the substrate body 10 and the tip faces of the lead conductors 54, 56. This increases the contact areas between the external electrodes 70, 72 and the lead conductors 54, 56, and therefore good electrical connection can be achieved between the external electrodes 70, 72 and the lead conductors 54, 56. Also, because decrease in the joining strength between the coil component 500 and the circuit board can be prevented owing to the concaved parts 80, 82, the solder thicknesses between the faces 86, 88 of the external electrodes 70, 72 and the land patterns on the circuit board can be made thinner. As a result, the distances between the faces 86, 88 of the external electrodes 70, 72 and the land patterns can be made smaller, and therefore the electrical resistances between the lead conductors 54, 56 and the land patterns can be reduced. Because the electrical resistances are reduced, the amounts of heat generated when large electrical current is applied can be reduced.

The smaller and lighter the coil component 500, the more markedly the joining strength of the coil component 500 decreases with respect to the circuit board. When the size of the coil component 500 is expressed by length×width×height, for example, preferably the concaved parts 80, 82 are provided when the ratio of height to width (height/width) is 0.5 or smaller, or more preferably the concaved parts 80, 82 are provided when it is 0.3 or smaller. In addition, preferably the concaved parts 80, 82 are provided when the height of the coil component 500 is 0.5 mm or smaller, or more preferably the concaved parts 80, 82 are provided when it is 0.3 mm or smaller. Incidentally, examples of coil component 500 sizes (length×width×height) that make providing the concaved parts 80, 82 preferable include: 0.2 mm×0.1 mm×0.1 mm, 0.3 mm×0.2 mm×0.1 mm, 0.3 mm×0.2 mm×0.2 mm, 0.4 mm×0.2 mm×0.2 mm, 0.6 mm×0.3 mm×0.3 mm, 1.0 mm×0.5 mm×0.3 mm, 1.6 mm×0.8 mm×0.3 mm, 1.6 mm×0.8 mm×0.4 mm, 1.6 mm×0.8 mm×0.5 mm, 1.6 mm×1.0 mm×0.3 mm, 1.6 mm×1.0 mm×0.4 mm, 1.6 mm×1.0 mm×0.5 mm, 1.6 mm×1.2 mm×0.3 mm, 1.6 mm×1.2 mm×0.4 mm, 1.6 mm×1.2 mm×0.5 mm, 2.0 mm×1.2 mm×0.3 mm, 2.0 mm×1.2 mm×0.4 mm, 2.0 mm×1.2 mm×0.5 mm, 2.0 mm×1.2 mm×0.6 mm, 2.0 mm×1.6 mm×0.3 mm, 2.0 mm×1.6 mm×0.5 mm, 2.0 mm×1.6 mm×0.6 mm, and 2.0 mm×1.6 mm×0.8 mm, and the like.

The external electrodes 70, 72 may be formed in a manner extending from the bottom face 12, partially onto the bottom face 12 side of the end faces 16a, 16b, of the substrate body 10. For example, the external electrodes 70, 72 may be formed in a manner extending onto the end faces 16a, 16b, by the thicknesses of the solder supplied to the land patterns on the circuit board, from the bottom face 12, of the substrate body 10. For example, the heights of the external electrodes 70, 72 extending onto the end faces 16a, 16b, from the bottom face 12, of the substrate body 10, may be a height of 50 μm or smaller toward the top face 14 side with reference to the bottom face 12. This prevents solder fillets from forming on the coil component 500 when the coil component 500 is mounted on a circuit board, and allows the solder to wet and spread over the external electrodes 70, 72 provided on the end faces 16a, 16b. As a result, the joining strength of the coil component 500 with the circuit board on which it has been mounted can be effectively improved without increasing the mounting area. Although each face of the substrate body 10 may have its sides or corners tapered or rounded, etc., the external electrodes may be formed in a manner extending onto these sides or corner portions.

While FIG. 4 illustrated an example where the shapes of the concaved parts 80, 82 on the face 86, 88 sides were circular, they may be oval. The overall shapes of the concaved parts 80, 82 may be spherical or oval-spherical with an outward bulge, for example. When the shapes of the concaved parts 80, 82 at the faces 86, 88 are oval, the lengths of their long diameters are preferably 1.2 times or shorter than, or more preferably 1.1 times or shorter than, the lengths of the short diameters. By keeping to these ranges, decrease in the joining strength of the coil component 500 with respect to the circuit board can be effectively prevented in all directions parallel with the faces 86, 88.

Figure 5A:
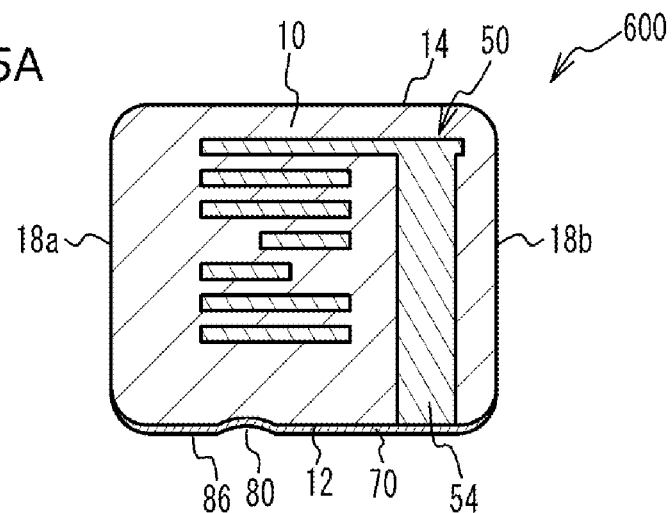
Figure 5B:
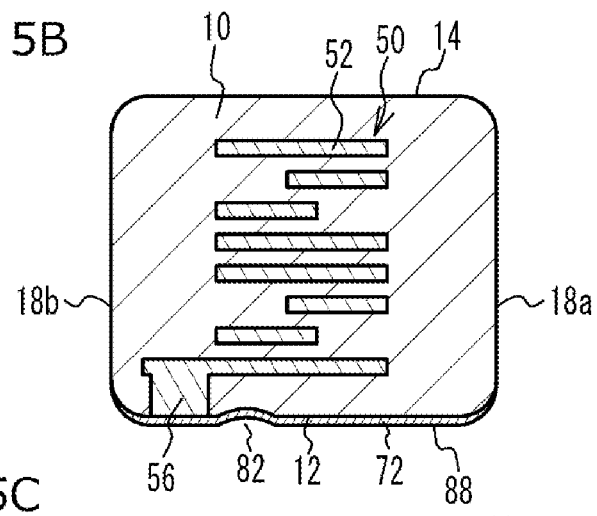
Figure 5C:
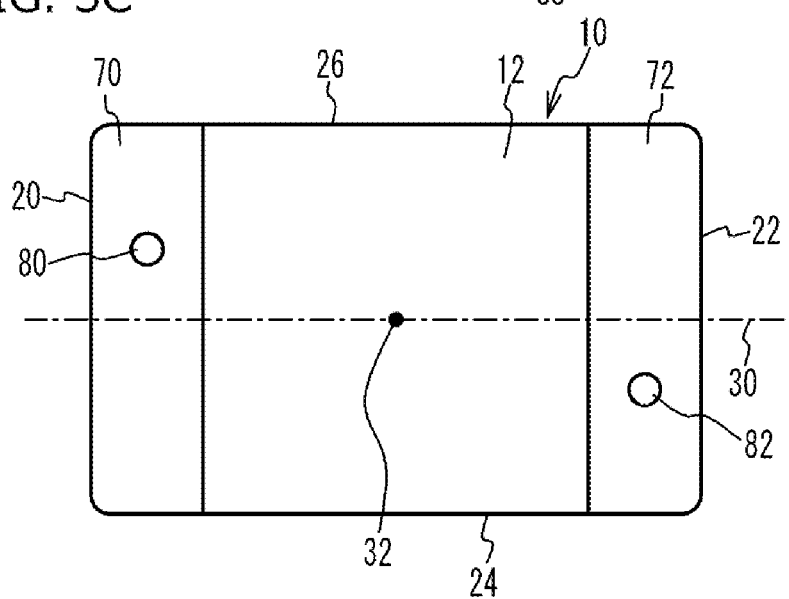
FIG. 5C is a plan view, looking at the bottom face, through the inside, from the top face side, of the coil component in the second embodiment of the invention under the present application for patent.

The coil component 600 pertaining to the second embodiment of the invention under the present application for patent is explained by referring to FIGS. 5A to 5C. FIGS. 5A and 5B are cross-sectional views of the coil component 600 pertaining to the second embodiment of the invention under the present application for patent, while FIG. 5C is a plan view looking at the bottom face, through the inside, from the top face side, of the coil component 600. It should be noted that, in FIG. 5C, the internal conductor provided in the substrate body 10 is not shown for the sake of illustrative clarity.

As shown in FIGS. 5A to 5C, the coil component 600 is such that the tip faces of the lead conductors 54, 56 are not concaved from the bottom face 12 of the substrate body 10, but the tip faces of the lead conductors 54, 56 are flush with the bottom face 12 of the substrate body 10. It should be noted that the term "flush" used here is not limited to "flat" in the strictest sense, and there may be a little height difference corresponding to a manufacturing error or so. The external electrode 70 has a concaved part 80 on the opposite side of the side where the lead conductor 54 is led out to the bottom face 12 of the substrate body 10 with respect to a center line 30 passing through the respective centers of the sides 20, 22, representing a pair of short sides, that constitute the bottom face 12 of the substrate body 10. The external electrode 72 has a concaved part 82 on the same side as the side where the lead conductor 56 is led out to the bottom face 12 of the substrate body 10 with respect to the center line 30. The concaved parts 80, 82 are provided at positions symmetrical to each other with respect to the center 32 of the bottom face 12 of the substrate body 10. The concaved parts 80, 82 are formed as a result of the external electrodes 70, 72 extending over the bottom face 12 of the substrate body 10 along the concaves formed on the bottom face 12 of the substrate body 10. The remaining constitutions are the same as those of the coil component 500 in the first embodiment and therefore not explained.

The concaves on the bottom face 12 of the substrate body 10 may be formed according to the following method. Multiple green sheets are stacked in a prescribed order, including green sheets on which a resin has been printed at desired positions where concaves are to be formed on the bottom face 12 of the substrate body 10, after which a pressure is applied in the stacking direction to pressure-bond the multiple green sheets. By cutting the pressure-bonded green sheets into individual chips and then sintering them, the resin is broken down and removed, and thus concaves are formed on the bottom face 12 of the substrate body 10. Thereafter, external electrodes 70, 72 are formed over the bottom face 12 of the substrate body 10, including locations where the concaves have been formed, and consequently concaved parts 80, 82 are formed on the external electrodes 70, 72. In the coil component 600, the depths at the deepest parts of the concaved parts 80, 82 from the faces 86, 88 may be 5 μm to 20 μm.

From the viewpoint of preventing the joining strength of the coil component 600 with respect to the circuit board from decreasing, by increasing the anchor effect from the solder entering the concaved parts 80, 82 and the amount of solder for joining, the depths of the deepest parts of the concaved parts 80, 82 from the faces 86, 88 are preferably 5 μm or greater, or more preferably 8 μm or greater, or yet more preferably 12 μm or greater. The diameters of the concaved parts 80, 82 at the faces 86, 88 are preferably 50 μm or greater, or more preferably 120 μm or greater, or yet more preferably 190 μm or greater. On the other hand, from the viewpoint of exhausting the air inside the concaved parts 80, 82 and filling the entire concaved parts 80, 82 with the solder, the depths at the deepest parts of the concaved parts 80, 82 from the faces 86, 88 are 20 μm or smaller, or more preferably 17 μm or smaller, or yet more preferably 14 μm or smaller. The diameters of the concaved parts 80, 82 at the faces 86, 88 are, from the viewpoint of exhausting the air inside the concaved parts 80, 82 and filling the entire concaved parts 80, 82 with the solder, preferably 300 μm or smaller, or more preferably 260 μm or smaller, or yet more preferably 220 μm or smaller. By keeping to these ranges, the concaved parts 80, 82 can be formed in a stable manner using a relatively easy method.

For the coil component 500 in the first embodiment, an example was given where the concaved parts 80, 82 were formed on the external electrodes 70, 72 as a result of the external electrodes 70, 72 covering the bottom face 12 of the substrate body 10 and the tip faces of the lead conductors 54, 56 concaved from the bottom face 12; however, this is not the only case. Just like the coil component 600 in the second embodiment, the concaved parts 80, 82 may be formed on the external electrodes 70, 72 as a result of concaves formed on the bottom faces 12 of the substrate body 10 at positions different from the lead conductors 54, 56, and the external electrodes 70, 72 provided over the bottom face 12 of the substrate body 10 including these concaves. Also, the concaved parts 80, 82 may be formed on the external electrodes 70, 72 in a state where no concaves have been formed on the bottom face 12 of the substrate body 10. In this case, it may be such that the external electrodes 70, 72 are not present, but the bottom face 12 of the substrate body 10 is exposed instead, at the bottom faces of the concaved parts 80, 82. The concaved parts 80, 82 at the bottom faces of which the bottom face 12 of the substrate body 10 is exposed, may be formed by arranging the locations that will become the concaved parts 80, 82 to be not printed on during the printing to form the external electrodes 70, 72.

Preferably the concaved part 80 of the external electrode 70 and the concaved part 82 of the external electrode 72 are provided at positions symmetrical to each other with respect to the center 32 of the bottom face 12 of the substrate body 10. This way, the coil component 600 can be prevented from tilting irregularly when the external electrodes 70, 72 are pressed against the solder supplied to the land patterns on the circuit board. This prevents the coil component 600 from shifting from the prescribed position during reflow soldering.

Figure 6A:
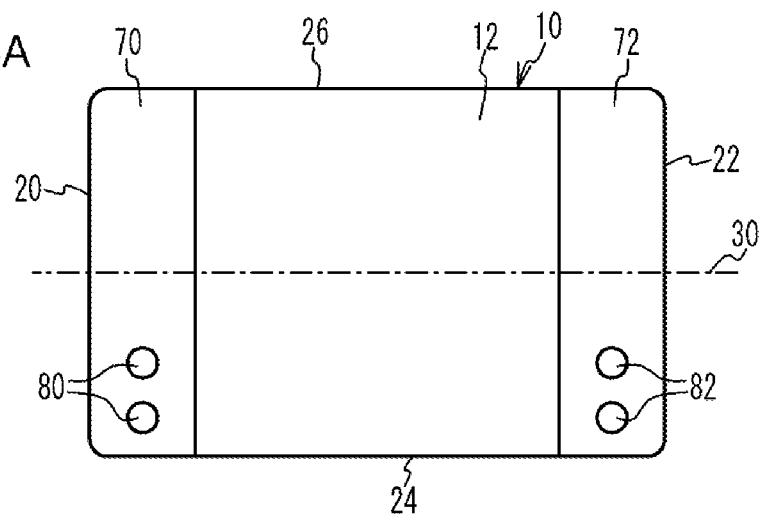
FIGS. 6A to 6C are drawings showing other examples of the concaved parts formed on the external electrodes.
Figure 6B:
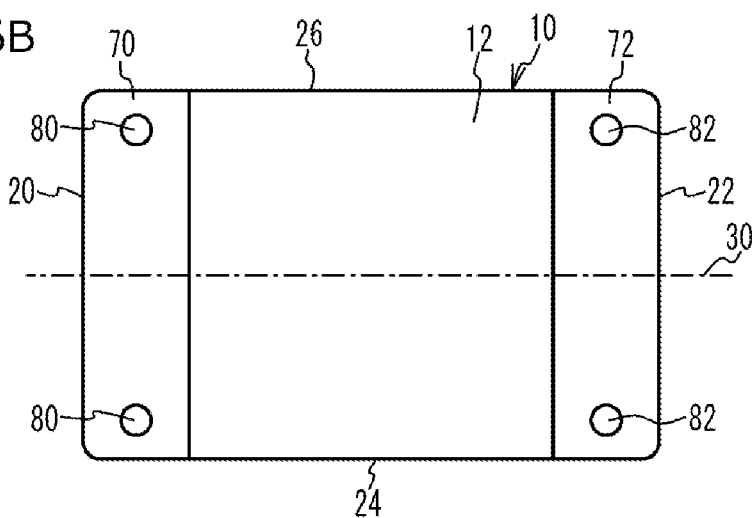
Figure 6C:
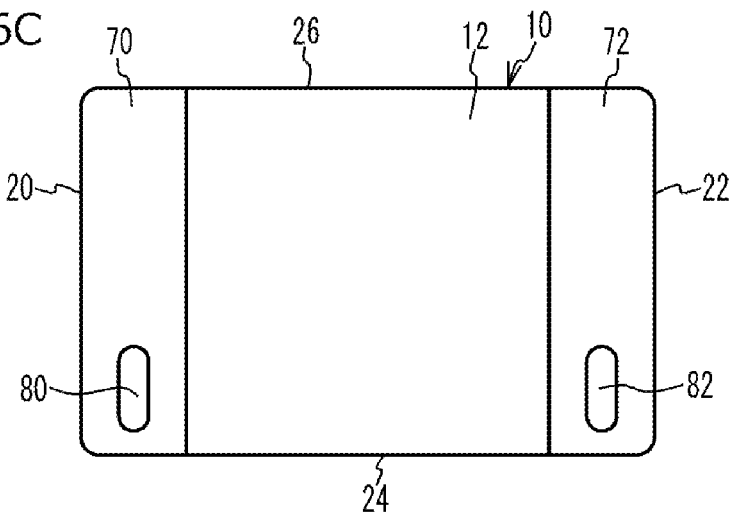

FIGS. 6A to 6C are drawings showing other examples of the concaved parts 80, 82 formed on the external electrodes 70, 72. FIGS. 6A to 6C are plan views, looking at the bottom faces, through the insides, from the top face sides, of the coil components, where the internal conductors are not shown for the sake of illustrative clarity. As shown in FIG. 6A, the external electrode 70 may have two concaved parts 80 on the same side with respect to the center line 30 passing through the respective centers of the sides 20, 22, representing a pair of short sides, that constitute the bottom face 12 of the substrate body 10. The same goes for the external electrode 72. As shown in FIG. 6B, the external electrode 70 may have two concaved parts 80 at positions symmetrical to each other with respect to the center line 30 passing through the respective centers of the sides 20, 22, representing a pair of short sides, that constitute the bottom face 12 of the substrate body 10. The same goes for the external electrode 72. As described above, providing multiple concaved parts 80, 82 on the external electrodes 70, 72 increases the number of concaved parts the solder will enter when the coil component is mounted on a circuit board. As a result, decrease in the joining strength of the coil component with respect to the circuit board can be effectively prevented, even when the size of the coil component is reduced.

As shown in FIG. 6C, the external electrodes 70, 72 may have concaved parts 80, 82 having bottom faces of larger areas than the end faces of the lead conductors 54, 56, at the locations where the lead conductors 54, 56 are led out to the bottom face 12 of the substrate body 10. In this case, the amount of solder entering the concaved parts will increase when the coil component is mounted on a circuit board, and therefore decrease in the joining strength of the coil component with respect to the circuit board can be effectively prevented, even when the size of the coil component is reduced.

The coil component 700 pertaining to the third embodiment of the invention under the present application for patent is explained by referring to FIG. 7. FIG. 7 is a plan view, looking at the bottom face, through the inside, from the top face side, of the coil component 700 pertaining to the third embodiment of the invention under the present application for patent. It should be noted that, in FIG. 7, the internal conductor provided in the substrate body 10 is not shown, while the external electrodes 70, 72 are hatched, for the sake of illustrative clarity. As shown in FIG. 7, the coil component 700 is such that a groove part 81, one end of which is connected to the concaved part 80 and the other end of which is open to the outer edge of the external electrode 70, is provided on the external electrode 70. Similarly, a groove part 83, one end of which is connected to the concaved part 82 and the other end of which is open to the outer edge of the external electrode 72, is provided on the external electrode 72. The groove parts 81, 83 are open to the outside of the coil component 700 from the outer edges of the external electrodes 70, 72. At the bottom faces of the groove parts 81, 83, the external electrodes 70, 72 are not provided, but the bottom face 12 of the substrate body 10 is exposed instead. The remaining constitutions are the same as those of the coil component 500 in the first embodiment and therefore not explained.

According to the coil component 700, the external electrodes 70, 72 have the concaved parts 80, 82 that are positioned on the inner side of the outer edges of the external electrodes 70, 72, as well as the groove parts 81, 83 that extend from the concaved parts 80, 82 to the outer edges of the external electrodes 70, 72 and open to the outer edges. With the coil component 500 in the first embodiment, air may remain in the concaved parts 80, 82 when the coil component 500 is mounted on a circuit board with a solder. In contrast, the coil component 700 in the third embodiment can prevent air from remaining inside the concaved parts 80, 82 because the groove parts 81, 83 are provided that extend from the concaved parts 80, 82 to the outer edges of the external electrodes 70, 72 and open to the outer edges.

At the bottom faces of the groove parts 81, 83, the external electrodes 70, 72 are not provided, but the bottom face 12 of the substrate body 10 is exposed instead. This way, the groove parts 81, 83 become deeper, which allows for effective prevention of air from remaining inside the concaved parts 80, 82. It should be noted that the external electrodes 70, 72 may be provided at the bottom faces of the groove parts 81, 83.

According to the third embodiment, presence of the groove parts 81, 83 can effectively prevent air from remaining inside the concaved parts 80, 82, and this allows the depths of the deepest parts of the concaved parts 80, 82 from the faces 86, 88 to be made even deeper. The depths of the deepest parts of the concaved parts 80, 82 from the faces 86, 88 are approx. 5 µm to 50 µm, for example, and 30 µm in one example. The diameters of the concaved parts 80, 82 at the faces 86, 88, as with the other embodiments, are 50 µm to 300 µm, for example, and 150 µm in one example.

From the viewpoint of preventing the joining strength of the coil component 700 with respect to the circuit board from decreasing, by increasing the anchor effect from the solder entering the concaved parts 80, 82 and the amount of solder for joining, the depths of the deepest parts of the concaved parts 80, 82 from the faces 86, 88 are preferably 5 µm or greater, or more preferably 20 µm or greater, or yet more preferably 30 µm or greater. The diameters of the concaved parts 80, 82 at the faces 86, 88 are preferably 50 µm or greater, or more preferably 120 µm or greater, or yet more preferably 190 µm or greater. On the other hand, from the viewpoint of the amount of solder to be supplied when the coil component 700 is mounted on a circuit board, the depths at the deepest parts of the concaved parts 80, 82 from the faces 86, 88 are 50 µm or smaller, or more preferably 40 µm or smaller, or yet more preferably 30 µm or smaller. The diameters of the concaved parts 80, 82 at the faces 86, 88 are, from the viewpoint of exhausting the air inside the concaved parts 80, 82 and filling the entire concaved parts 80, 82 with the solder, preferably 300 µm or smaller, or more preferably 260 µm or smaller, or yet more preferably 220 µm or smaller. By keeping to these ranges, the concaved parts 80, 82 can be formed in a stable manner using a relatively easy method.

Figure 8:
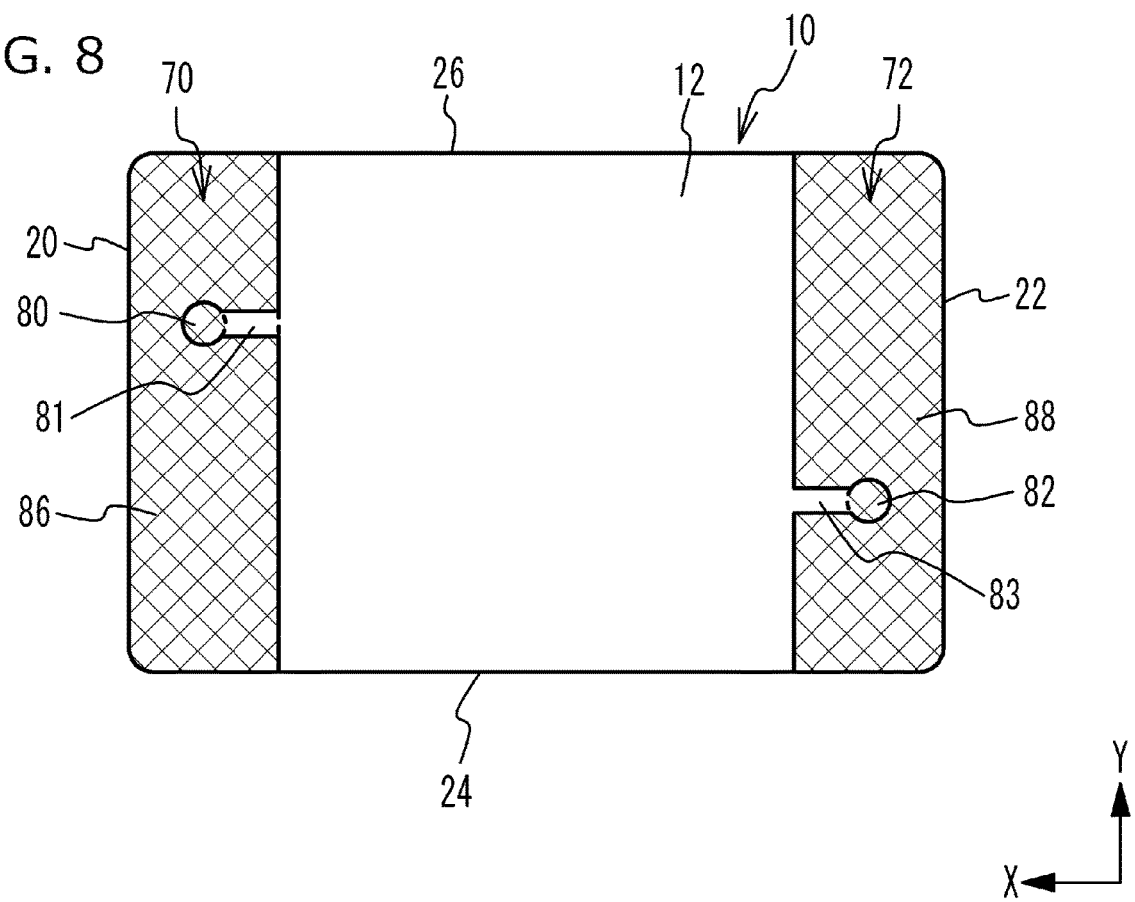
FIG. 8 is a plan view showing another example of the groove parts provided on the external electrodes.

FIG. 8 is a plan view showing another example of the groove parts 81, 83 provided on the external electrodes 70, 72. FIG. 8, just like FIG. 7, is a plan view, looking at the bottom face, through the inside, from the top face side, of the coil component, where the internal conductor provided in the substrate body 10 is not shown and the external electrodes 70, 72 are hatched. As shown in FIG. 8, the groove part 81 provided on the external electrode 70 is open to, among the outer edges of the external electrode 70, the outer edge facing the external electrode 72. The groove part 83 provided on the external electrode 72 is open to, among the outer edges of the external electrode 72, the outer edge facing the external electrode 70. The groove part 81 of the external electrode 70 and the groove part 83 of the external electrode 72 are open in a staggered manner in the Y direction crossing (such as crossing at right angles) the X direction in which the external electrode 70 and the external electrode 72 are facing each other.

As described above, the groove part 81 of the external electrode 70 is open to, among the outer edges of the external electrode 70, the outer edge facing the external electrode 72, while the groove part 83 of the external electrode 72 is open to, among the outer edges of the external electrode 72, the outer edge facing the external electrode 70. This, when the coil component is mounted on a circuit board with a solder, prevents the openings of the groove parts 81, 83 from being blocked with the solder. Also, because the groove part 81 of the external electrode 70 and the groove part 83 of the external electrode 72 are open in a staggered manner in the Y direction crossing the X direction in which the external electrode 70 and the external electrode 72 are facing each other, mutual interference between the air exhausted from the groove parts 81, 83 is prevented when the solder is embedded in the concaved parts 80, 82. This allows for effective prevention of air from remaining inside the concaved parts 80, 82.

Figure 9:
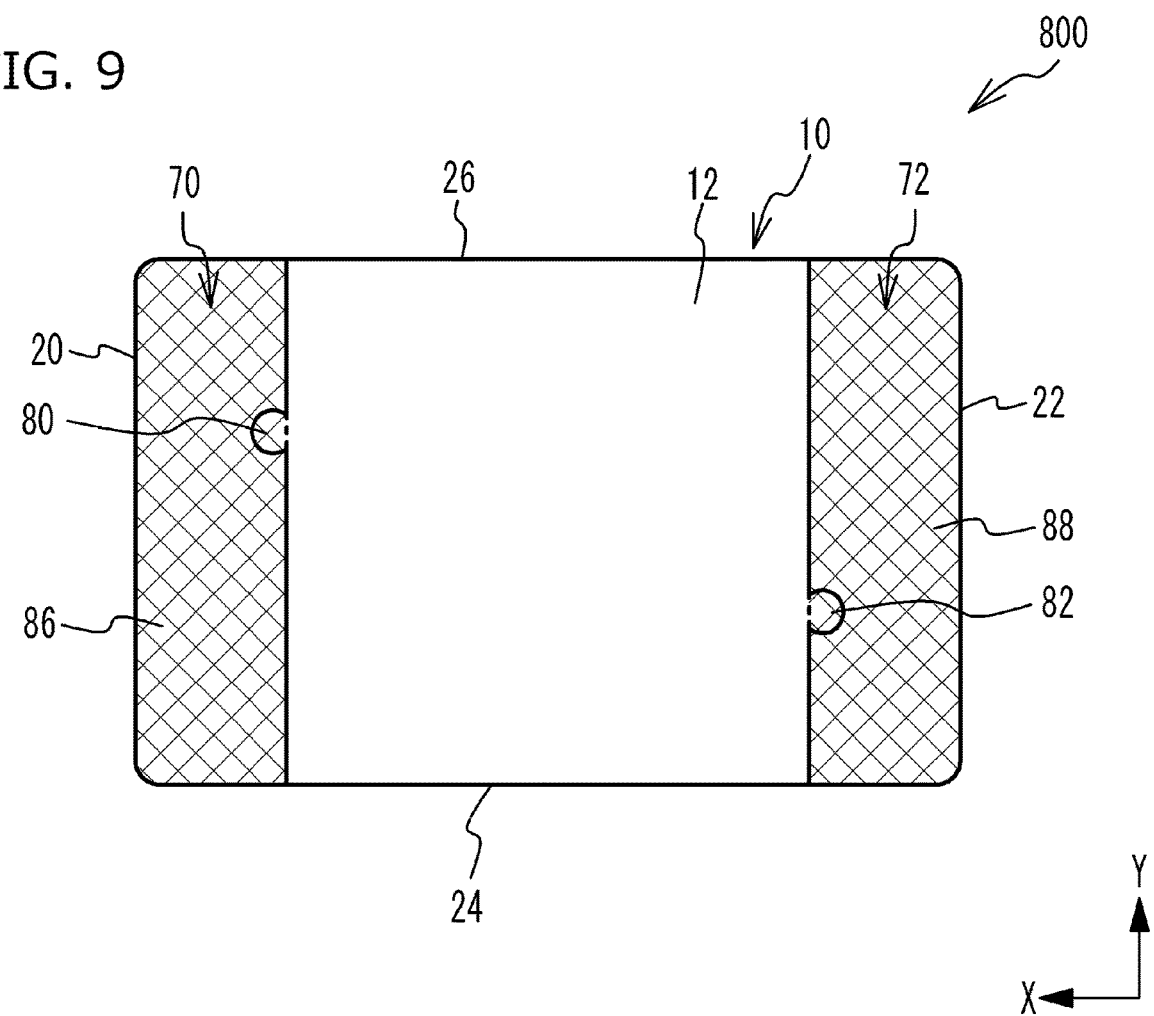
FIG. 9 is a plan view, looking at the bottom face, through the inside, from the top face side, of the coil component pertaining to the fourth embodiment of the invention under the present application for patent.

The coil component 800 pertaining to the fourth embodiment of the invention under the present application for patent is explained by referring to FIG. 9. FIG. 9 is a plan view, looking at the bottom face, through the inside, from the top face side, of the coil component 800 pertaining to the fourth embodiment of the invention under the present application for patent. It should be noted that, in FIG. 9, the internal conductor provided in the substrate body 10 is not shown, while the external electrodes 70, 72 are hatched, for the sake of illustrative clarity. As shown in FIG. 9, the coil component 800 is such that the concaved parts 80, 82 provided on the external electrodes 70, 72 are open to the outer edges of the external electrodes 70, 72. For example, the concaved part 80 is open to, among the outer edges of the external electrode 70, the outer edge facing the external electrode 72, while the concaved part 82 is open to, among the outer edges of the external electrode 72, the outer edge facing the external electrode 70. The concaved part 80 and the concaved part 82 are open in a staggered manner in the Y direction crossing (such as crossing at right angles) the X direction in which the external electrode 70 and the external electrode 72 are facing each other. The remaining constitutions are the same as those of the coil component 600 in the second embodiment and therefore not explained.

According to the coil component 800, the concaved parts 80, 82 provided on the external electrodes 70, 72 are open to the outer edges of the external electrodes 70, 72. This constitution, too, can prevent air from remaining inside the concaved parts 80, 82 when the coil component 800 is mounted on a circuit board with a solder.

Additionally, the coil component 800 is such that the concaved part 80 of the external electrode 70 is open to, among the outer edges of the external electrode 70, the outer edge facing the external electrode 72, while the concaved part 82 of the external electrode 72 is open to, among the outer edges of the external electrode 72, the outer edge facing the external electrode 70. The concaved part 80 and the concaved part 82 are open in a staggered manner in the Y direction crossing the X direction in which the external electrode 70 and the external electrode 72 are facing each other. This way, mutual interference between the air exhausted from the concaved parts 80, 82 is prevented when the solder is embedded in the concaved parts 80, 82. This allows for effective prevention of air from remaining inside the concaved parts 80, 82.

Figure 10A:
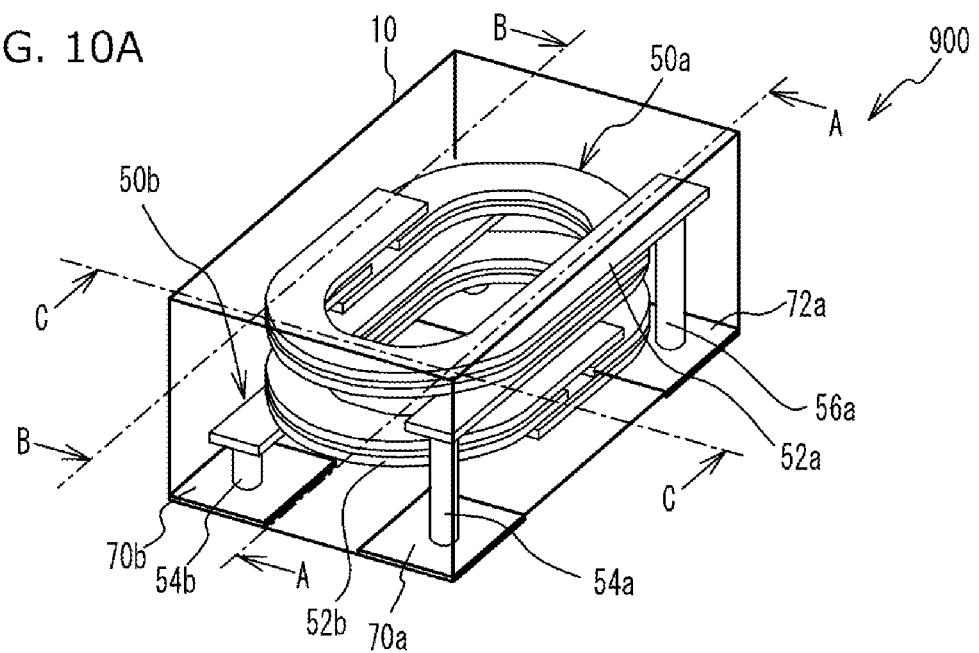
Figure 10B:
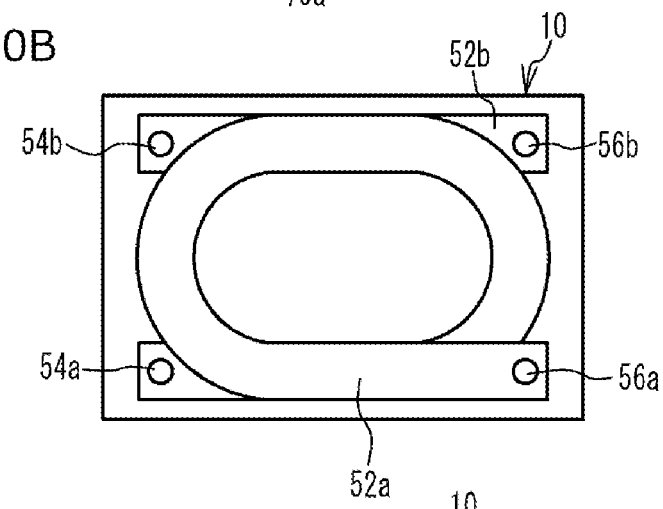
FIG. 10B is a plan view showing the inside, from the top face side.
Figure 10C:
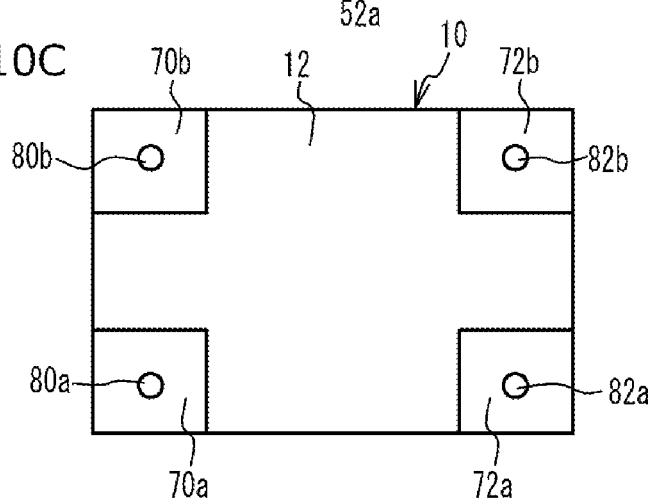
FIG. 10C is a plan view looking at the bottom face, through the inside, from the top face side, of the coil component pertaining to the fifth embodiment of the invention under the present application for patent.
Figure 11A:
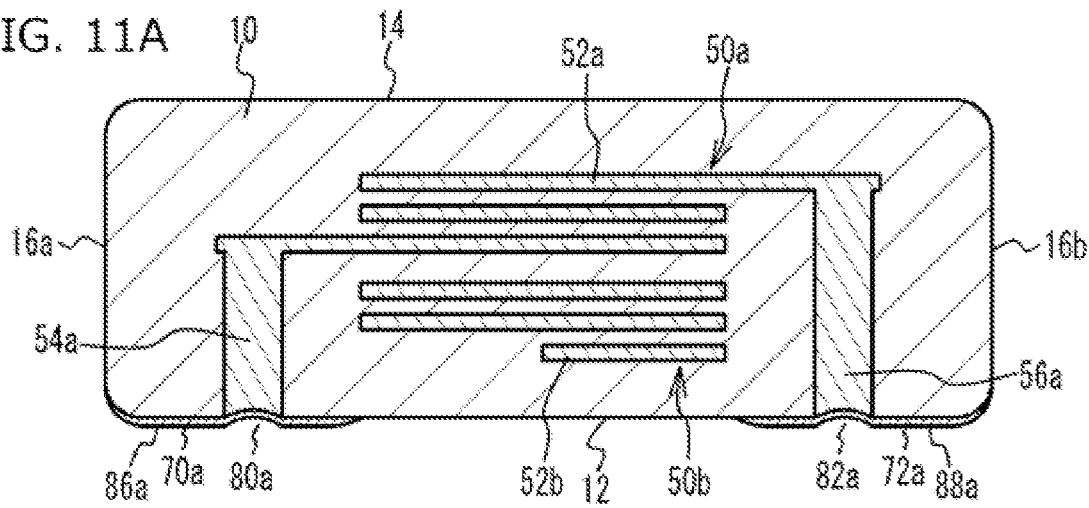
FIGS. 11A to 11C are views of cross-sections A-A to C-C in FIG. 10A, respectively.
Figure 11B:
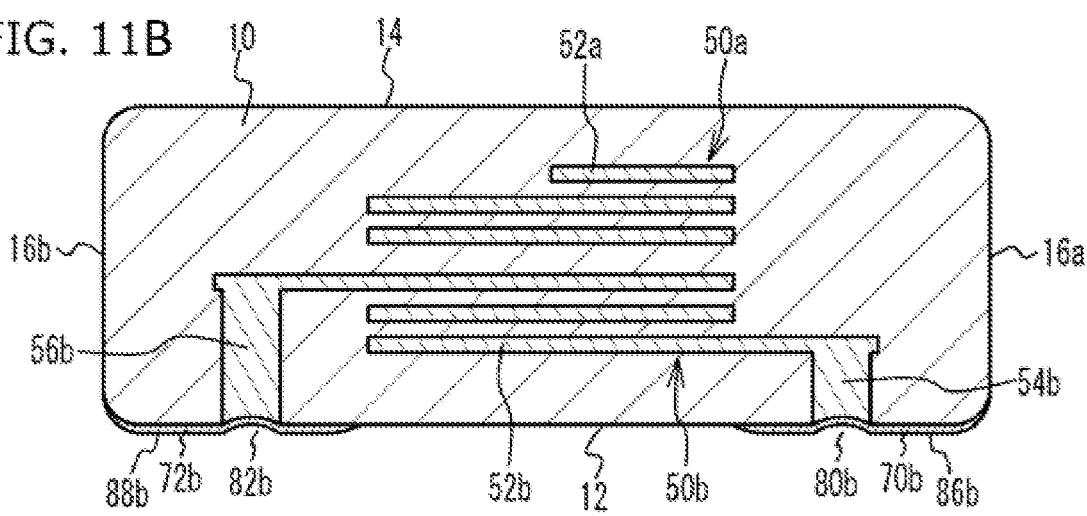
Figure 11C:
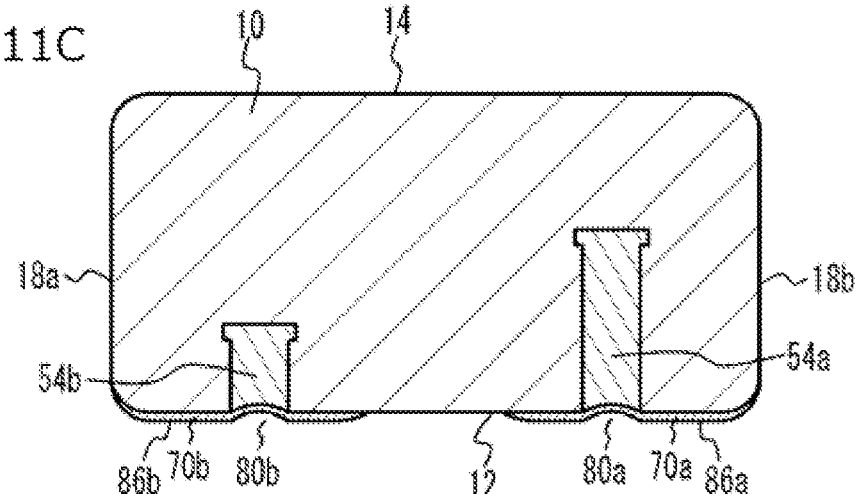

The coil component 900 pertaining to the fifth embodiment of the invention under the present application for patent is explained by referring to FIGS. 10A to 10C and 11A to 11C. FIG. 10A is a transparent perspective view, while FIG. 10B is a plan view showing through the inside, from the top face side, and FIG. 10C is a plan view looking at the bottom face, through the inside, from the top face side, of the coil component 900 pertaining to the fifth embodiment of the invention under the present application for patent. It should be noted that, in FIG. 10C, the internal conductor provided in the substrate body 10 is not shown for the sake of illustrative clarity. FIGS. 11A to 11C are views of cross-sections A-A to C-C in FIG. 10A, respectively.

As shown in FIGS. 10A to 10C and 11A to 11C, the coil component 900 is such that two electrically-separated internal conductors 50a, 50b are built into the substrate body 10. The internal conductor 50a includes a coil conductor 52a that forms a coil, as well as lead conductors 54a, 56a led out from both end parts of the coil conductor 52a. The coil conductor 52a extends radially. The lead conductors 54a, 56a are led out straight from both end parts of the coil conductor 52a toward the bottom face 12 of the substrate body 10. The tip faces of the lead conductors 54a, 56a are concaved from the bottom face 12 of the substrate body 10. The internal conductor 50b includes a coil conductor 52b that forms a coil, as well as lead conductors 54b, 56b led out from both end parts of the coil conductor 52b. The coil conductor 52b extends radially. The lead conductors 54b, 56b are led out straight from both end parts of the coil conductor 52b toward the bottom face 12 of the substrate body 10. The tip faces of the lead conductors 54b, 56b are concaved from the bottom face 12 of the substrate body 10.

Four external electrodes 70a, 72a, 70b, 72b, which are external terminals for surface mounting, are provided on the bottom face 12 of the substrate body 10. The external electrodes 70a, 72a, 70b, 72b are provided near the four corners of the bottom face 12 of the substrate body 10, and not provided on the top face 14, end faces 16a, 16b, or side faces 18a, 18b. The external electrode 70a has a concaved part 80a which is connected to the lead conductor 54a exposed on the bottom face 12 of the substrate body 10, and which is formed as a result of the tip face of the lead conductor 54a being concaved from the bottom face 12 of the substrate body 10. The external electrode 72a has a concaved part 82a which is connected to the lead conductor 56a exposed on the bottom face 12 of the substrate body 10, and which is formed as a result of the tip face of the lead conductor 56a being concaved from the bottom face 12 of the substrate body 10. Similarly, the external electrode 70b has a concaved part 80b which is connected to the lead conductor 54b exposed on the bottom face 12 of the substrate body 10, and which is formed as a result of the tip face of the lead conductor 54b being concaved from the bottom face 12 of the substrate body 10. The external electrode 72b has a concaved part 82b which is connected to the lead conductor 56b exposed on the bottom face 12 of the substrate body 10, and which is formed as a result of the tip face of the lead conductor 56b being concaved from the bottom face 12 of the substrate body 10.

According to the coil component 900, the electrically-separated internal conductors 50a, 50b, which include the coil conductors 52a, 52b, are built into the substrate body 10. The lead conductors 54a, 56a led out from both end parts of the coil conductor 52a are connected to the external electrodes 70a, 72a provided on the bottom face 12 of the substrate body 10. The lead conductors 54b, 56b led out from both end parts of the coil conductor 52b are connected to the external electrodes 70b, 72b provided on the bottom face 12 of the substrate body 10. The external electrodes 70a, 72a, 70b, 72b have faces 86a, 88a, 86b, 88b parallel with the bottom face 12 of the substrate body 10, as well as concaved parts 80a, 82a, 80b, 82b which are concaved from these parallel faces 86a, 88a, 86b, 88b toward the bottom face 12 side of the substrate body 10 and whose shapes at the parallel faces 86a, 88a, 86b, 88b are circular. This way, when the coil component 900 is mounted on a circuit board, the solder enters the concaved parts 80a, 82a, 80b, 82b and produces an anchor effect. As a result, decrease in the joining strength of the coil component 900 with respect to the circuit board can be prevented, even when the coil component 900 is small in size. Because the shapes of the concaved parts 80a, 82a, 80b, 82b at the faces 86a, 88a, 86b, 88b are circular, decrease in the joining strength of the coil component 900 with respect to the circuit board can be prevented in all directions parallel with the faces 86a, 88a, 86b, 88b. Additionally, because only the concaved parts 80a, 82a, 80b, 82b are provided on the external electrodes 70a, 72a, 70b, 72b, size increase of the coil component 900 can be prevented.

Figure 12:
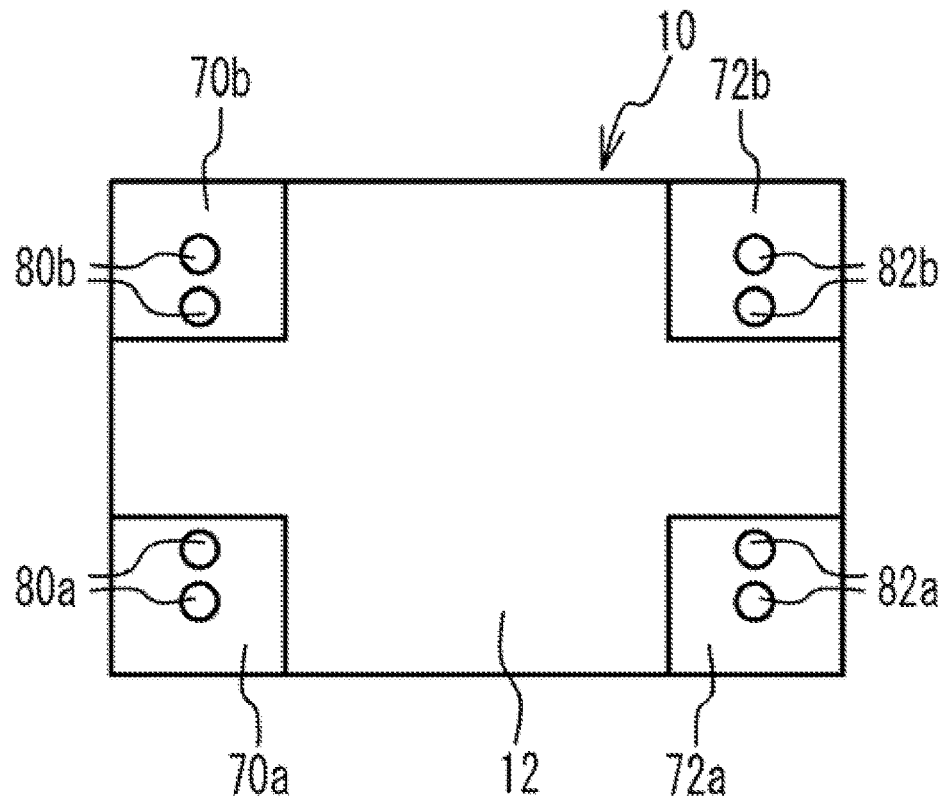
FIG. 12 is a drawing showing another example of the concaved parts formed on the external electrodes.

FIG. 12 is a drawing showing another example of the concaved parts 80a, 82a, 80b, 82b formed on the external electrodes 70a, 72a, 70b, 72b. While FIG. 12 is a plan view looking at the bottom face, through the inside, from the top face side, of the coil component, the internal conductor is not shown for the sake of illustrative clarity. As shown in FIG. 12, the external electrodes 70a, 72a, 70b, 72b may each have multiple concaved parts 80a, 82a, 80b, 82b. This increases the number of concaved parts the solder will enter when the coil component is mounted on a circuit board. As a result, decrease in the joining strength of the coil component with respect to the circuit board can be effectively prevented.

Figure 13A:
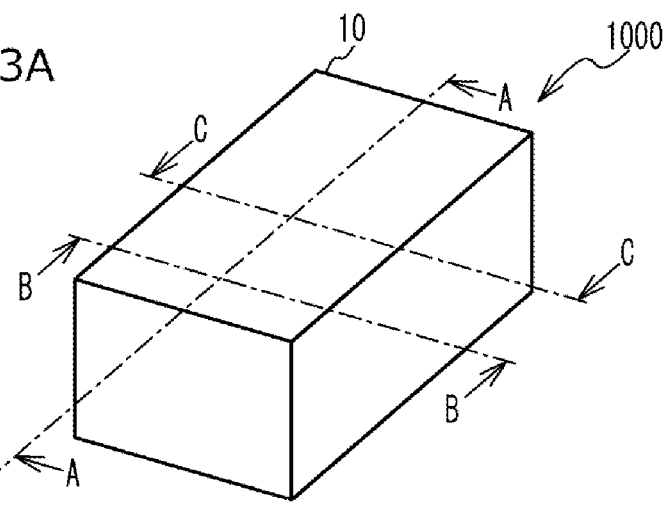
Figure 13B:
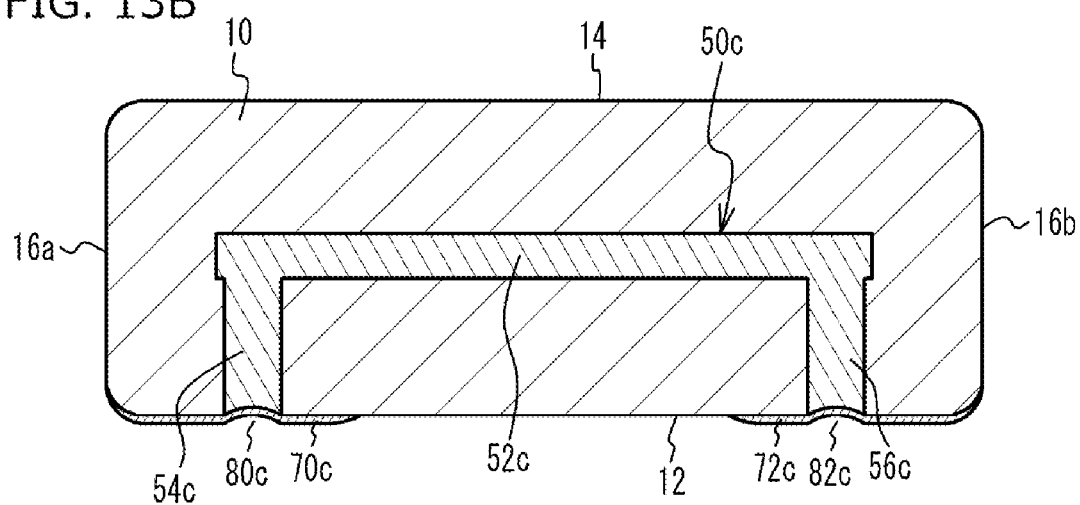
FIGS. 13B to 13D are views of cross-sections A-A to C-C in FIG. 13A, respectively.
Figure 13C:
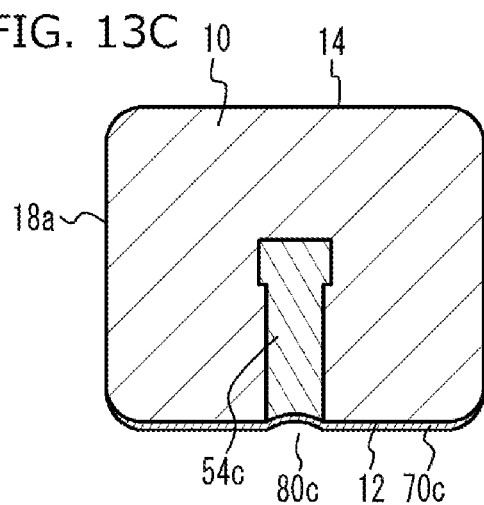
Figure 13D:
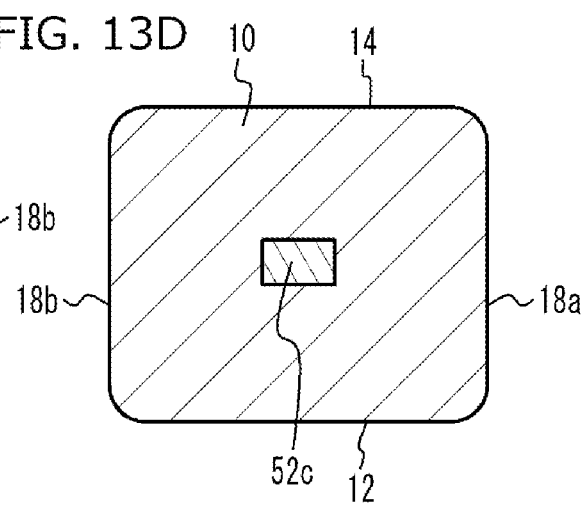

The coil component 1000 pertaining to the sixth embodiment of the invention under the present application for patent is explained by referring to FIGS. 13A to 13D. FIG. 13A is a perspective view of the coil component 1000 pertaining to the sixth embodiment of the invention under the present application for patent, while FIGS. 13B to 13D are views of cross-sections A-A to C-C in FIG. 13A, respectively. As shown in FIGS. 13A to 13D, the coil component 1000 is such that an internal conductor 50c including a linear coil conductor 52c that forms a coil, as well as lead conductors 54c, 56c led out from both end parts of the coil conductor 52c, is built into the substrate body 10. The lead conductors 54c, 56c are led out straight toward the bottom face 12 of the substrate body 10, and their tip faces are concaved from the bottom face 12 of the substrate body 10. External electrodes 70c, 72c provided on the bottom face 12 of the substrate body 10 have concaved parts 80c, 82c that are formed as a result of the tip faces of the lead conductors 54c, 56c being concaved from the bottom face 12 of the substrate body 10.

Just like the coil component 500 in the first embodiment, the coil conductor 52 that forms a coil may extend radially; or, just like the coil component 1000 in the sixth embodiment, the coil conductor 52c that forms a coil may extend linearly.

Figure 14:
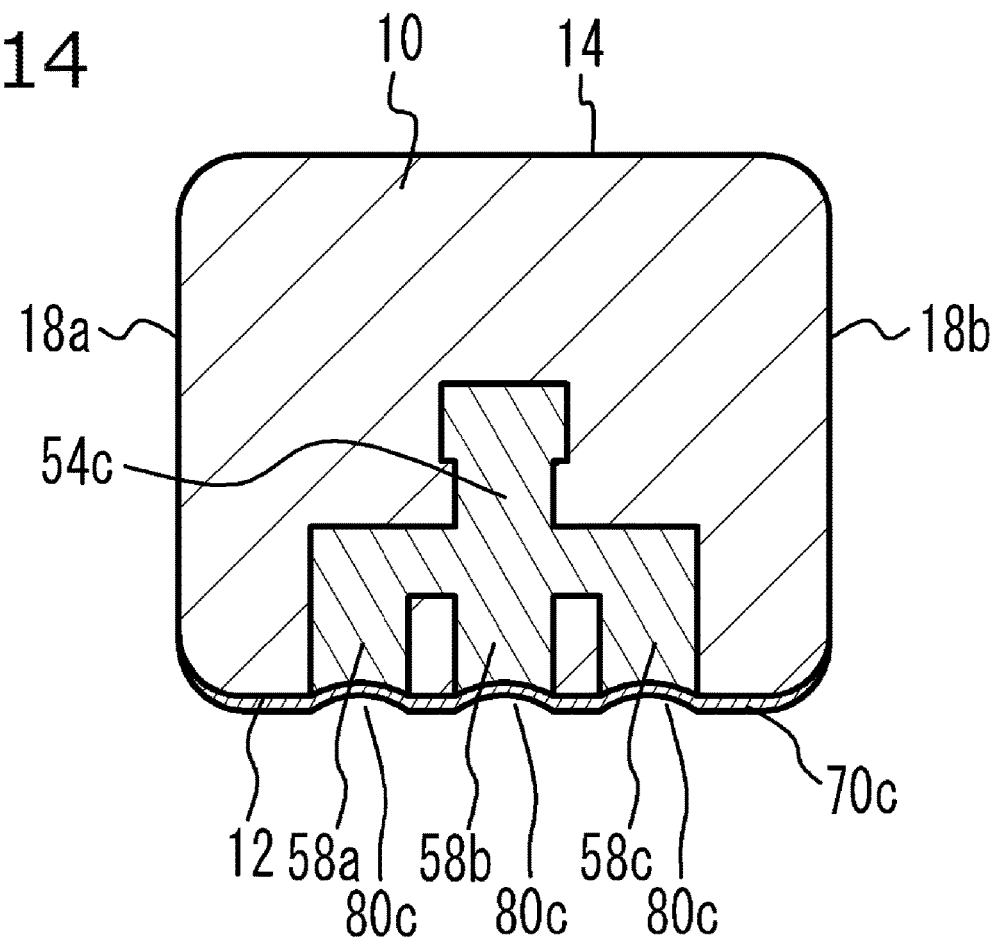
FIG. 14 is a cross-sectional view of the coil component where the lead conductor is led out to the bottom face of the substrate body after branching into multiple conductors.

With the coil component 1000, the lead conductors 54c, 56c are each led out as a single conductor from the coil conductor 52c to the bottom face 12 of the substrate body 10 without branching; however, this is not the only case and the lead conductors 54c, 56c may be led out to the bottom face 12 of the substrate body 10 after branching into multiple conductors. FIG. 14 is a cross-sectional view where the lead conductors 54c, 56c are led out to the bottom face 12 of the substrate body 10 after branching into multiple conductors. As shown in FIG. 14, the lead conductor 54c is led out to the bottom face 12 of the substrate body 10 after branching into three conductors 58a to 58c, where the tip faces of the conductors 58a to 58c are each concaved from the bottom face 12 of the substrate body 10. The external electrode 70c has three concaved parts 80c that are formed as a result of the tip faces of the conductors 58a to 58c being concaved from the bottom face 12 of the substrate body 10. The lead conductor 56c and external electrode 72c have the same shapes and are therefore not explained.

As described above, the lead conductor 54c may branch into multiple conductors 58a to 58c and are led out to the bottom face 12 of the substrate body 10, where the tip faces of the multiple conductors 58a to 58c may be concaved from the bottom face 12 of the substrate body 10. The external electrode 70c may have three concaved parts 80c that are formed as a result of the tip faces of the conductors 58a to 58c being concaved from the bottom face 12 of the substrate body 10. This increases the number of concaved parts the solder will enter when the coil component is mounted on a circuit board. As a result, decrease in the joining strength of the coil component with respect to the circuit board can be effectively prevented. Additionally, the external electrode 70c now contacts each of the multiple conductors 58a to 58c, which allows for increase in the contact area between the external electrode 70c and the lead conductor 54c. As a result, good electrical connection can be achieved between the external electrode 70c and the lead conductor 54c. The same goes for the lead conductor 56c and the external electrode 72c.

When the lead conductor 54c is led out to the bottom face 12 of the substrate body 10 after branching into three conductors 58a to 58c, preferably the lead conductor 56c is also led out to the bottom face 12 of the substrate body 10 after branching into three conductors. This way, the concaved part 80c formed on the external electrode 70c, and the concaved part 82c formed on the external electrode 72c, can be provided at positions symmetrical to each other with respect to the center of the bottom face 12 of the substrate body 10. As a result, the coil component can be prevented from tilting irregularly when its external electrodes 70c, 72c are pressed against the solder supplied to land patterns on a circuit board.

Figure 15A:
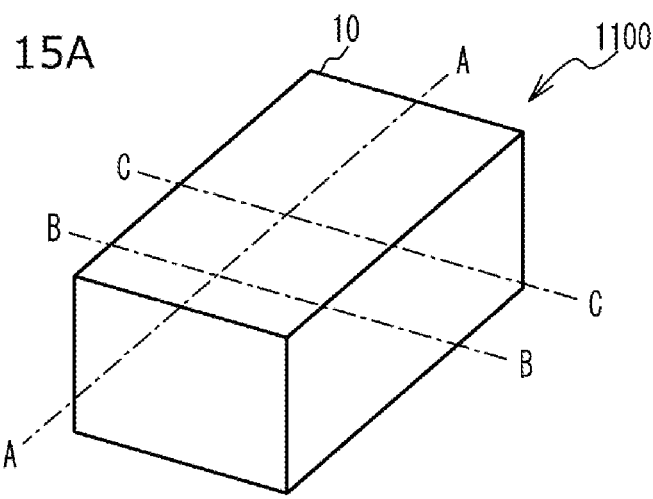
Figure 15B:
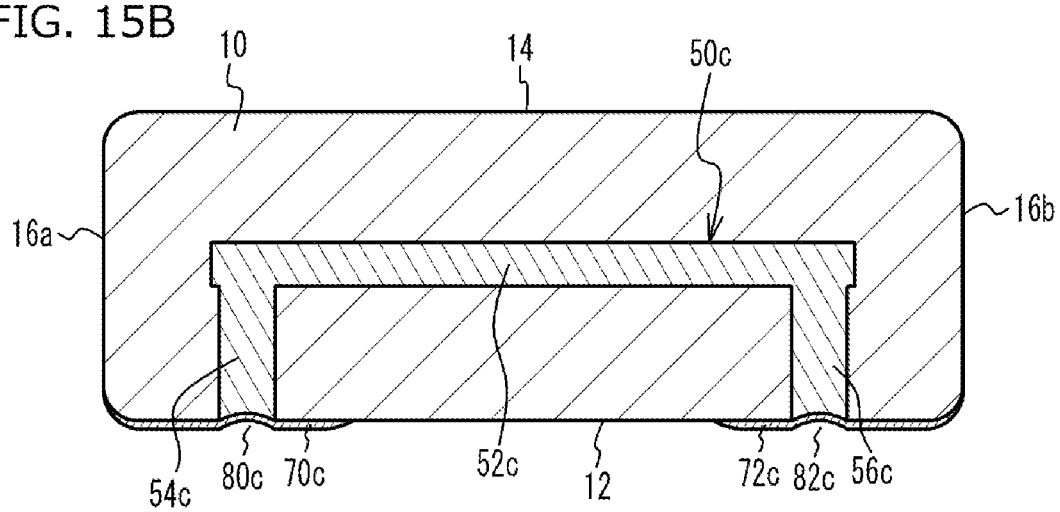
FIGS. 15B to 15D are views of cross-sections A-A to C-C in FIG. 15A, respectively.
Figure 15C:
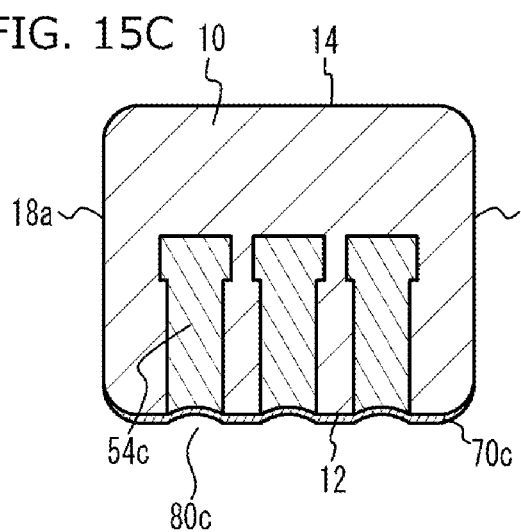
Figure 15D:
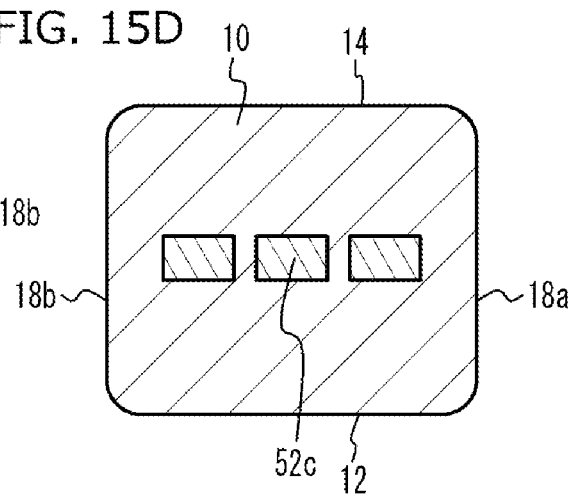

The coil component 1100 pertaining to the seventh embodiment of the invention under the present application for patent is explained by referring to FIGS. 15A to 15D. FIG. 15A is a perspective view of the coil component 1100 pertaining to the seventh embodiment of the invention under the present application for patent, while FIGS. 15B to 15D are views of cross-sections A-A to C-C in FIG. 15A, respectively. For the coil component 1000 in the sixth embodiment, an example was given where, as shown in FIGS. 13A to 13D, one linear coil conductor 52c that formed a coil was provided in the substrate body 10. With the coil component 1100 in the seventh embodiment, three linear coil conductors 52c are provided in the substrate body 10, as shown in FIGS. 15A to 15D. The remaining constitutions are the same as those of the coil component 1000 in the sixth embodiment and therefore not explained.

It is not limited that one linear coil conductor 52c is provided in the substrate body 10; instead, just like the coil component 1100, there may be three or other multiple numbers of conductors.

Figure 16A:
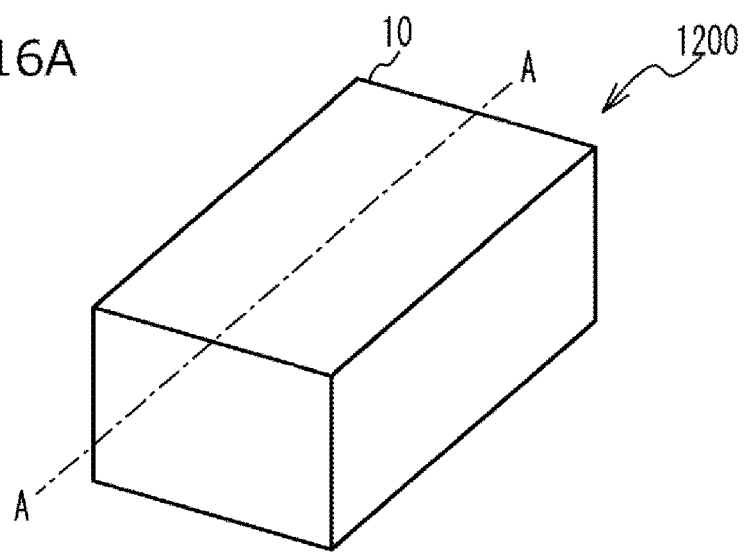
Figure 16B:
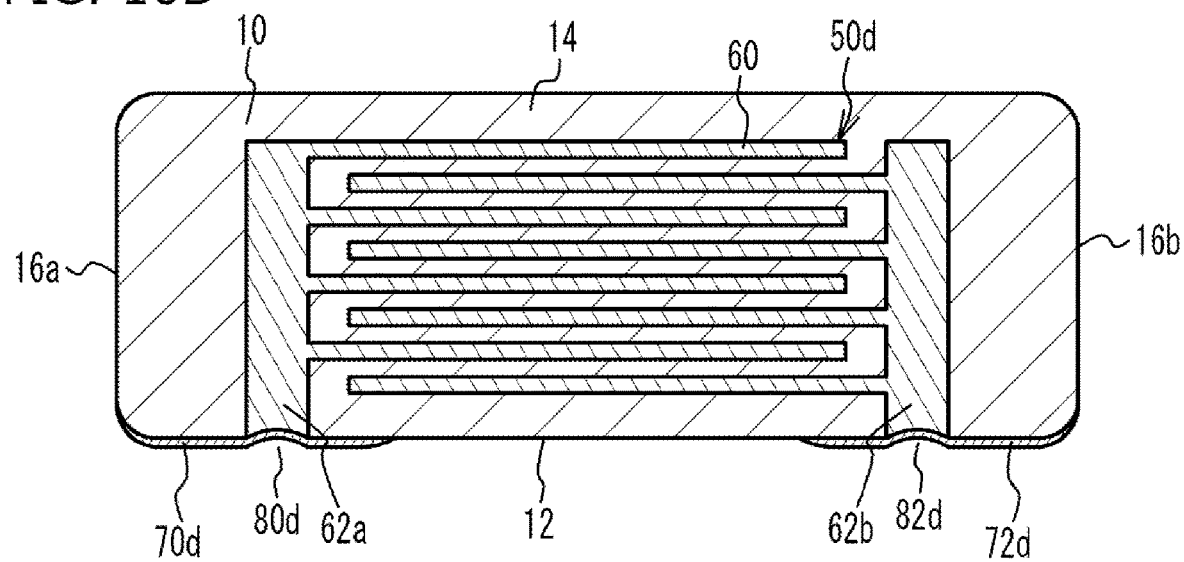
FIG. 16B is a view of cross-section A-A in FIG. 16A.

The capacitor component 1200 pertaining to the eighth embodiment of the invention under the present application for patent is explained by referring to FIGS. 16A and 16B. FIG. 16A is a perspective view of the capacitor component 1200 pertaining to the eighth embodiment of the invention under the present application for patent, while FIG. 16B is a view of cross-section A-A in FIG. 16A. As shown in FIGS. 16A and 16B, the capacitor component 1200 is such that an internal conductor 50d including a capacitor conductor 60 that forms a capacitor, as well as lead conductors 62a, 62b led out from the capacitor conductor 60, is provided in the substrate body 10. The lead conductors 62a, 62b are led out straight toward the bottom face 12 of the substrate body 10, and their tip faces are concaved from the bottom face 12 of the substrate body 10. External electrodes 70d, 72d provided on the bottom face 12 of the substrate body 10 have concaved parts 80d, 82d that are formed as a result of the tip faces of the lead conductors 62a, 62b being concaved from the bottom face 12 of the substrate body 10. With the capacitor component 1200, the substrate body 10 is formed by, for example, barium titanate ($BaTiO_3$), calcium titanate ($CaTiO_3$), strontium titanate ($SrTiO_3$), etc. The capacitor conductor 60 is formed by, for example, nickel, palladium, silver-palladium, or other metal material. The lead conductors 62a, 62b are formed by, for example, nickel, palladium, silver-palladium, or other metal material, just like the capacitor conductor 60; however, metals such as copper and silver may be used in areas where inter-conductor potential difference does not generate.

The internal conductor built into the substrate body 10 may include a coil conductor that forms a coil, or it may include a capacitor conductor 60 that forms a capacitor. It should be noted that the internal conductor built into the substrate body 10 may include, for example, a conductor that forms a thermistor, varistor, etc.

The external electrode is not limited to a monohedral electrode provided only on the bottom face 12, which is a mounting face, of the substrate body 10. For example, the external electrode may be a dihedral electrode which is provided on the bottom face 12 and top face 14 of the substrate body 10 and electrically connected by a through electrode that penetrates through the substrate body 10. In this case, electrical connection can be achieved even when the passive component is mounted on a circuit board with its top face and bottom face oriented upside down. For example, the external electrode may be an L-shaped electrode having a portion extending from the bottom face 12, to the end face 16a or 16b, of the substrate body 10 as a solder wetting and spreading portion. In this case, when the passive component is mounted on a circuit board, solder fillets do not generate and the solder wets and spreads over the end face 16a or 16b into shape, which allows for improvement of the joining strength without increasing the mounting area.

Figure 17:
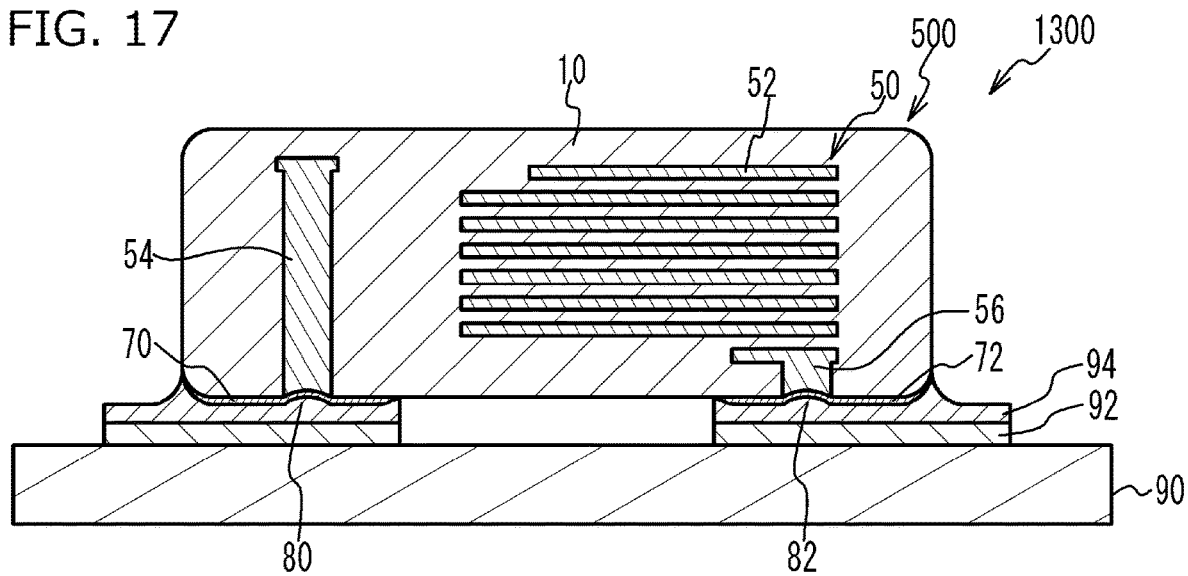
FIG. 17 is a cross-sectional view of an electronic device comprising the coil component pertaining to the first embodiment of the invention under the present application for patent.

FIG. 17 is a cross-sectional view of an electronic device 1300 comprising the coil component 500 pertaining to the first embodiment of the invention under the present application for patent. As shown in FIG. 17, the electronic device 1300 comprises a circuit board 90 and a coil component 500 mounted on the circuit board 90. The coil component 500 is mounted on the circuit board 90 as a result of its external electrodes 70, 72 joined to land patterns 92 provided on the circuit board 90 with a solder 94.

The electronic device 1300 is such that the coil component 500 is mounted on the circuit board 90. The coil component 500 has concaved parts 80, 82 formed on its external electrodes 70, 72. As a result, the solder 94 enters the concaved parts 80, 82 and the external electrodes 70, 72 will be joined to the solder 94. This means that, even when the coil component 500 is reduced in size, decrease in the joining strength between the coil component 500 and the circuit board 90 can be prevented. It should be noted that, while an example where the coil component 500 in the first embodiment was mounted on the circuit board 90 was given for the electronic device 1300, any of the coil components in the second embodiment through the fifth embodiment or the capacitor component in the sixth embodiment may be mounted on the circuit board.

Figure 18:
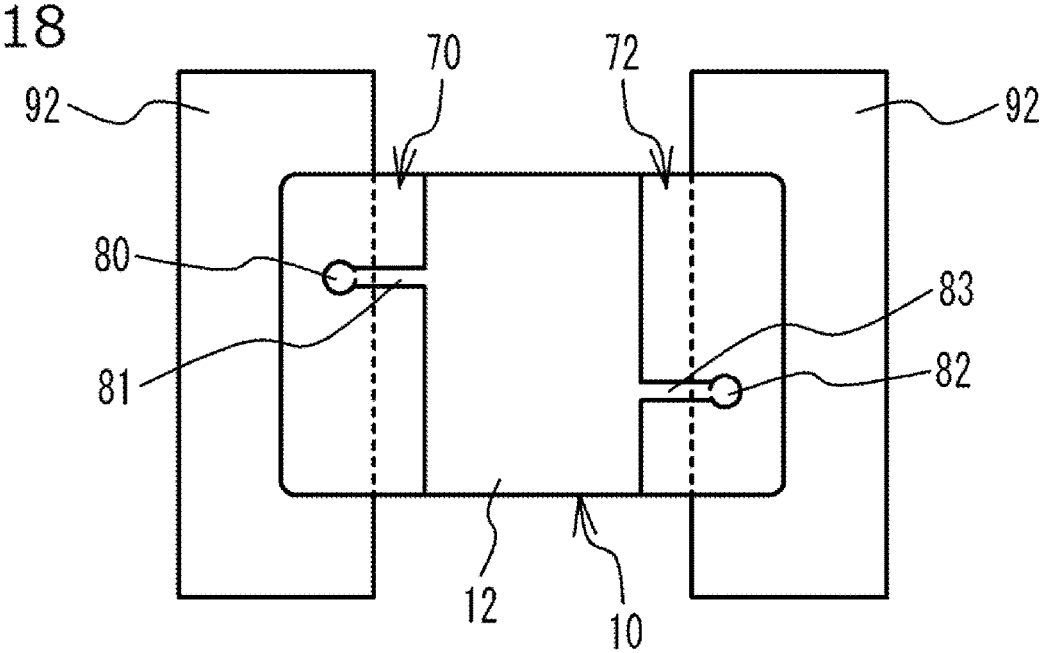
FIG. 18 is a plan view showing an example, when groove parts are provided on the external electrodes, of the position relationships between the groove parts and the land patterns on the circuit board.

FIG. 18 is a plan view showing an example, when groove parts 81, 83 are provided on the external electrodes 70, 72, of the position relationships between the groove parts 81, 83 and the land patterns 92 on the circuit board 90. It should be noted that FIG. 18 is a plan view, looking through the inside of the substrate body of the coil component from the top face side of the electronic device. As shown in FIG. 18, on the external electrode 70, the groove part 81 is open to, among the outer edges of the external electrode 70, the outer edge facing the external electrode 72 and positioned away from the land pattern 92 on the circuit board 90. On the external electrode 72, the groove part 83 is open to, among the outer edges of the external electrode 72, the outer edge facing the external electrode 70 and positioned away from the land pattern 92 on the circuit board 90.

As described above, the groove parts 81, 83 are open to, among the outer edges of the external electrodes 70, 72, the outer edges other than those on the outer periphery of the bottom face 12 of the substrate body 10, which are positioned away from the land patterns 92; as a result, the openings of the groove parts 81, 83 can be effectively prevented from being blocked with the solder. This, in turn, can effectively prevent air from remaining inside the concaved parts 80, 82.

The foregoing described the embodiments of the invention under the present application for paten in detail; it should be noted, however, that the invention under the present application for patent is not limited to these specific embodiments, and various modifications and changes may be added to the extent that doing so does not deviate from the key points of the invention under the present application for patent as described in "What We/I Claim."

I claim:

1. A passive component being a surface mounting component, said passive component comprising:
   a substrate body having insulating property;
   an internal conductor built into the substrate body; and
   at least one external electrode provided on a planar mounting face of the substrate body and electrically connected to the internal conductor;
   wherein the external electrode has a face parallel with the planar mounting face of the substrate body, and a concaved part which is inwardly concaved relative to the parallel face toward the substrate body and is located, as viewed in a direction perpendicular to the parallel face, inside the parallel surface so as to be surrounded by the parallel surface.

2. The passive component according to claim 1, wherein the external electrode has the concaved part and a groove part extending from the concaved part to an outer periphery of the external electrode and outwardly open at the periphery of the external electrode in a direction parallel with the mounting face.

3. The passive component according to claim 2, wherein the mounting face of the substrate body is exposed at a base of the groove part.

4. The passive component according to claim 2, wherein:
   the at least one external electrode is constituted by multiple external electrodes which are provided on the mounting face of the substrate body;
   the multiple external electrodes include a first external electrode placed toward one side of a pair of opposing sides, and a second external electrode placed toward another side, of the mounting face of the substrate body;
   the groove part of the first external electrode opens at, among all outer edges constituting the outer periphery of the first external electrode, an outer edge facing the second external electrode; and
   the groove part of the second external electrode opens at, among all outer edges constituting the outer periphery of the second external electrode, an outer edge facing the first external electrode.

5. The passive component according to claim 4, wherein the groove of the first external electrode and the groove part of the second external electrode are open at the respective outer edges thereof in respective directions which are the same but out of alignment in a direction crossing a direction in which the first external electrode and the second external electrode are facing each other.

6. The passive component according to claim 1, wherein:
   the at least one external electrode is constituted by multiple external electrodes which are provided on the mounting face of the substrate body;
   the multiple external electrodes include a first external electrode placed toward one side of a pair of opposing sides, and a second external electrode placed toward another side, of the mounting face of the substrate body; and
   the concaved part of the first external electrode and the concaved part of the second external electrode are provided at positions symmetrical to each other with respect to a center of the mounting face of the substrate body.

7. The passive component according to claim 1, wherein:
   the internal conductor includes a lead conductor which is led out to the mounting face of the substrate body and connected to the external electrode;
   a tip face representing an end face at a tip of the lead conductor is inwardly concaved from the mounting face of the substrate body; and
   the external electrode is formed in a manner superposing it on and in contact with a surface constituted by a part of the mounting face of the substrate body and the tip face of the lead conductor, wherein the concaved part of the external electrode is formed along the tip face.

8. The passive component according to claim 1, wherein the concaved part is entirely surrounded by the parallel surface as viewed in the direction perpendicular to the parallel face.

9. An electronic device, comprising:
   the passive component according to claim 1; and a circuit board on which the passive component is mounted wherein the external electrode of the passive component is joined to a land pattern with a solder.

10. The electronic device according to claim 9, wherein the external electrode has a groove part extending from the concaved part and open at, among all outer edges constituting the outer periphery of the external electrode, an outer edge positioned away from the land pattern, other than outer edges on an outer periphery of the mounting face of the substrate body.

\* \* \* \* \*